(12) United States Patent
Kume et al.

(10) Patent No.: US 9,196,731 B2
(45) Date of Patent: Nov. 24, 2015

(54) SEMICONDUCTOR DEVICE

(71) Applicant: Renesas Electronics Corporation, Kawasaki-shi (JP)

(72) Inventors: Ippei Kume, Kawasaki (JP); Takashi Onizawa, Kawasaki (JP); Takashi Hase, Kawasaki (JP); Shigeru Hirao, Kawasaki (JP); Tadatoshi Danno, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 14/455,725

(22) Filed: Aug. 8, 2014

(65) Prior Publication Data
US 2015/0060942 A1 Mar. 5, 2015

(30) Foreign Application Priority Data
Sep. 3, 2013 (JP) .................. 2013-182518

(51) Int. Cl.
*H01L 29/778* (2006.01)
*H01L 29/78* (2006.01)
*H01L 29/423* (2006.01)
*H01L 29/417* (2006.01)
*H01L 29/267* (2006.01)
*H01L 21/78* (2006.01)
*H01L 23/00* (2006.01)
*H01L 29/66* (2006.01)
*H01L 23/31* (2006.01)
*H01L 29/20* (2006.01)

(52) U.S. Cl.
CPC ............ *H01L 29/7849* (2013.01); *H01L 21/78* (2013.01); *H01L 23/3178* (2013.01); *H01L 29/267* (2013.01); *H01L 29/4236* (2013.01); *H01L 29/66462* (2013.01); *H01L 29/66522* (2013.01); *H01L 29/7786* (2013.01); *H01L 29/78* (2013.01); *H01L 23/562* (2013.01); *H01L 29/2003* (2013.01)

(58) Field of Classification Search
None
See application file for complete search history.

(56) References Cited

U.S. PATENT DOCUMENTS

| | | | |
|---|---|---|---|
| 6,703,253 B2 | 3/2004 | Koide | |
| 8,487,316 B2 | 7/2013 | Cheng et al. | |
| 2003/0181045 A1* | 9/2003 | Minn et al. | 438/689 |
| 2007/0119892 A1* | 5/2007 | Horsfield | 225/2 |
| 2009/0278236 A1* | 11/2009 | Sato et al. | 257/620 |
| 2011/0204488 A1 | 8/2011 | Itou et al. | |
| 2012/0256188 A1* | 10/2012 | McDonald et al. | 257/76 |
| 2013/0234297 A1* | 9/2013 | Breymesser et al. | 257/623 |

FOREIGN PATENT DOCUMENTS

| | | | |
|---|---|---|---|
| JP | 5-335292 A | 12/1993 | |
| JP | 2000-22213 A | 1/2000 | |
| JP | 2003-152220 A | 5/2003 | |
| JP | 2008-21689 A | 1/2008 | |

(Continued)

*Primary Examiner* — Erik Kielin
(74) *Attorney, Agent, or Firm* — McGinn IP Law Group, PLLC

(57) ABSTRACT

Sometimes to warp a group III nitride semiconductor and a silicon by the stress of the group III nitride semiconductor acting on the silicon. A semiconductor device includes a substrate, a buffer layer, and a semiconductor layer. A trench is formed on a sixth face of the semiconductor layer. The trench passes through the semiconductor layer and the buffer layer. The bottom of the trench reaches at least the inside of the substrate.

19 Claims, 32 Drawing Sheets

(56) References Cited

FOREIGN PATENT DOCUMENTS

| | | |
|---|---|---|
| JP | 2008-277590 A | 11/2008 |
| JP | 2009-54659 A | 3/2009 |
| JP | 2011-101007 A | 5/2011 |
| JP | 2011-143518 A | 7/2011 |
| JP | 2011-192954 A | 9/2011 |

* cited by examiner

WF

Q

WF

Q

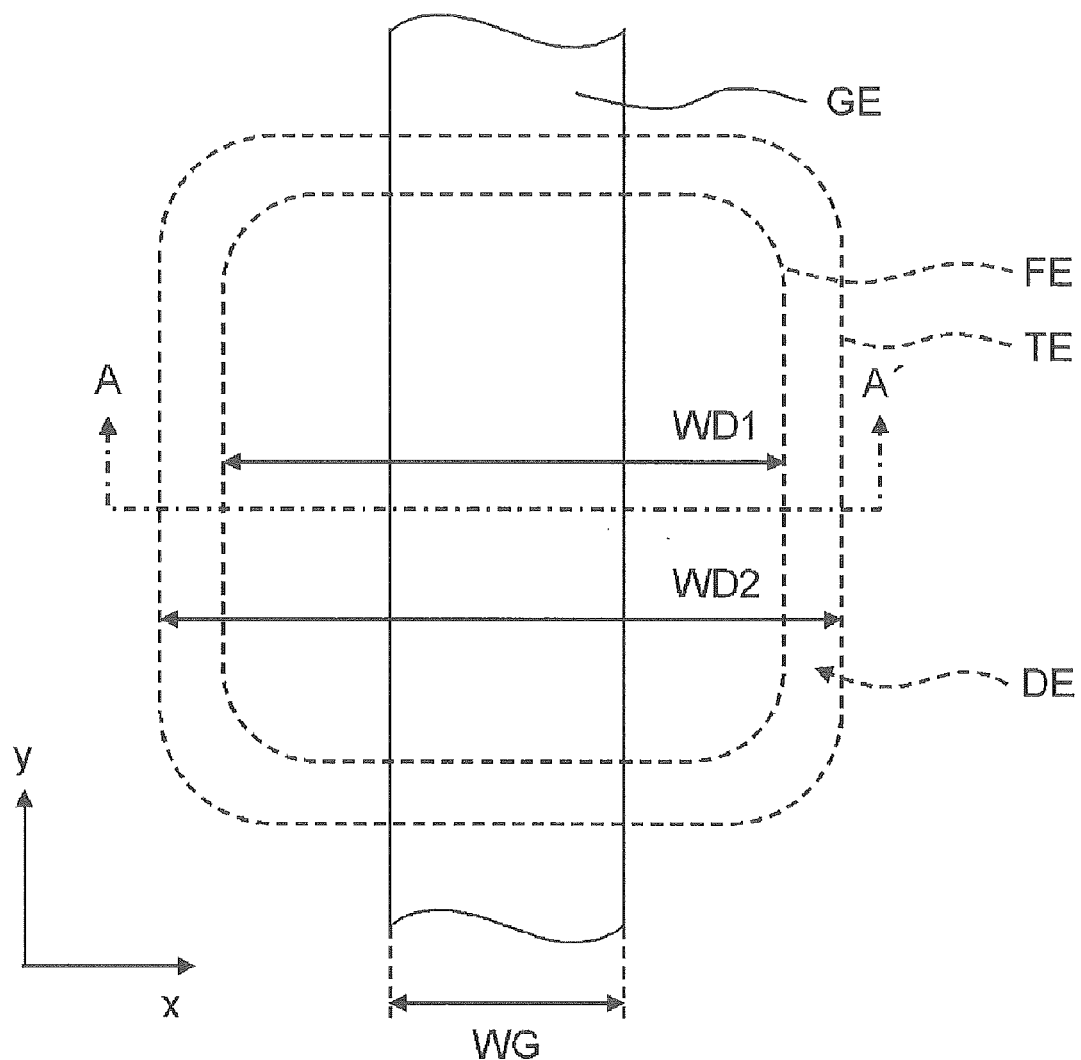

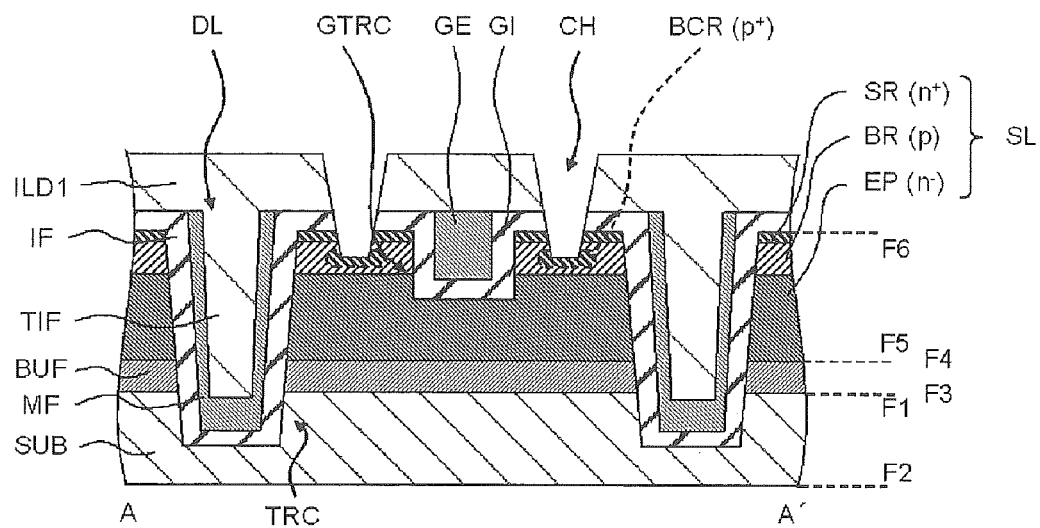
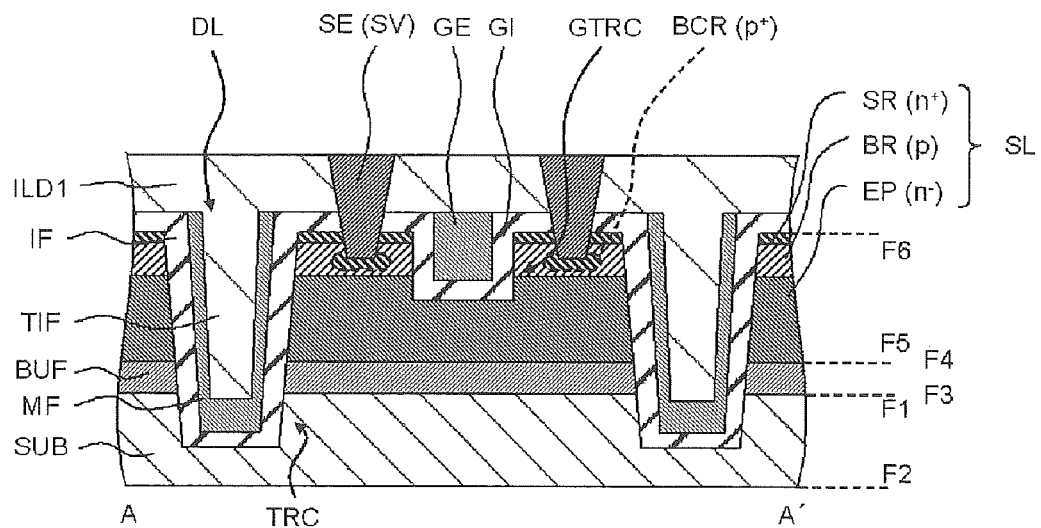

SEMICONDUCTOR DEVICE

CROSS-REFERENCE TO RELATED APPLICATION

The disclosure of Japanese Patent Application No. 2013-182518 filed on Sep. 3, 2013 including the specification, drawings and abstract is incorporated herein by reference in its entirety.

BACKGROUND

The present invention relates to a semiconductor device, for example, a technique applicable to a power transistor.

RELATED ART

At present, various techniques related to dicing of chips are proposed. Japanese Patent Laid-Open No. 2000-22213 (Patent Literature 1) describes that a first trench and a second trench are formed on a back surface of a substrate. The second trench is narrower than the first trench. Japanese Patent Laid-Open No. 2011-143518 (Patent Literature 2) describes that a trench is formed on one surface of a substrate and a trench is also formed on the other surface of the substrate. The trench formed on the other side of the substrate is provided in order to alleviate the stress generated in the substrate. Japanese Patent Laid-Open No. 1993-335292 (Patent Literature 3) describes a GaAs substrate attached to a glass plate. In Patent Literature 3, a trench is formed on a surface of the GaAs substrate. Japanese Patent Laid-Open No. 2011-192954 (Patent Literature 4) describes a semiconductor device including a silicon substrate and a compound semiconductor layer formed over the silicon substrate. In Patent Literature 4, trenches are formed on a surface of the compound semiconductor layer. The trenches are formed in a stripe shape in a plan view. Japanese Patent Laid-Open Nos. 2003-152220 (Patent Literature 5), 2008-277590 (Patent Literature 6), 2011-101007 (Patent Literature 7), and 2008-21689 (Patent Literature 8) describe a semiconductor device including a silicon substrate and a nitride semiconductor layer formed over the silicon substrate. A trench is formed on a surface of the nitride semiconductor layer. The bottom of the trench reaches the silicon substrate.

At present, various techniques related to a vertical transistor are proposed. Japanese Patent Laid-Open No. 2009-54659 (Patent Literature 9) describes a semiconductor device including a silicon substrate and a nitride semiconductor layer formed over the silicon substrate. In Patent Literature 9, a cathode electrode is provided on the back surface of the silicon substrate. The cathode electrode is coupled to the nitride semiconductor layer via a conductor buried in a trench formed in the silicon substrate.

SUMMARY

In some semiconductor devices, a group III nitride semiconductor is formed over silicon. In this case, the group III nitride semiconductor and the silicon may be warped by the stress of the group III nitride semiconductor acting on the silicon. A crack may be generated between the group III nitride semiconductor and the silicon by the warpage of the group III nitride semiconductor and the silicon. The other problems and the new feature of the present invention will become clear from the description of the present specification and the accompanying drawings.

According to an embodiment, a semiconductor device includes a substrate, a buffer layer, and a semiconductor layer. A trench is formed in a predetermined surface of the semiconductor layer. The trench passes through the semiconductor layer and the buffer layer. The bottom of the trench reaches at least the inside of the substrate.

According to the embodiment, the stress of the semiconductor layer acting on the substrate is alleviated.

BRIEF DESCRIPTION OF THE DRAWINGS

FIG. 17 is a plan view showing a gate electrode and a drain electrode of the semiconductor device according to the third embodiment;

FIGS. 32A and 32B are cross-sectional views showing a manufacturing method of the semiconductor device shown in FIG. 29.

DETAILED DESCRIPTION

Hereinafter, embodiments will be described with reference to the drawings. In all the drawings, the same symbol is attached to the same component and the explanation thereof is omitted as appropriate.

First Embodiment

Figure 1A:
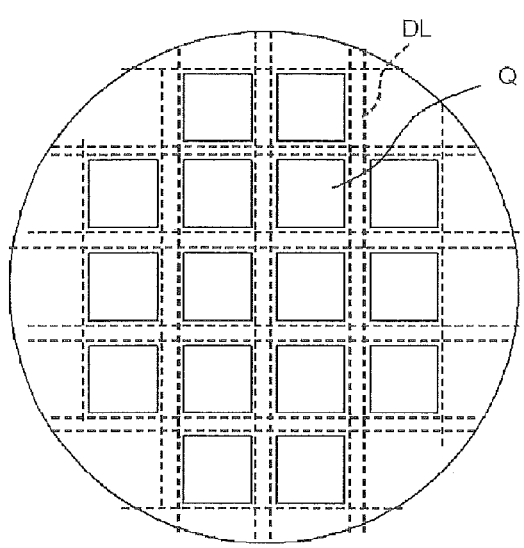
FIG. 1A is a plan view showing a wafer according to a first embodiment.
Figure 1B:
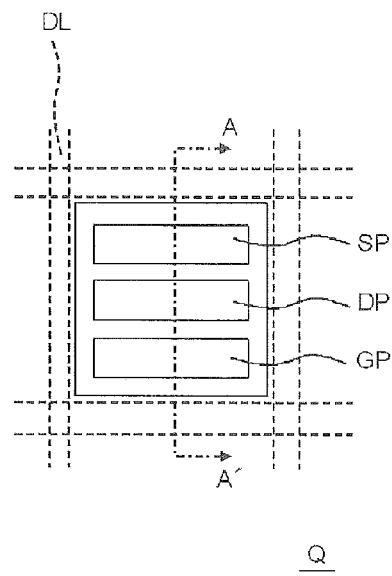
FIG. 1B is a plan view showing a chip according to the first embodiment.
Figure 2:
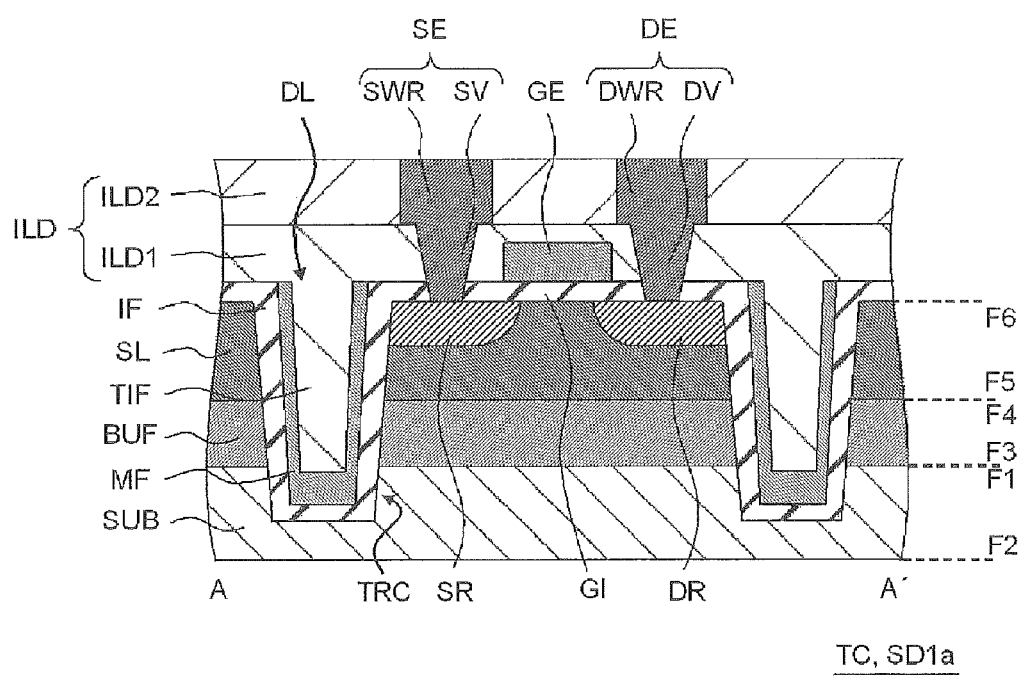
FIG. 2 is a cross-sectional view showing a semiconductor device according to a first example of the first embodiment.

FIG. 1A is a plan view showing a wafer WF according to a first embodiment. FIG. 1B is a plan view showing a chip Q according to the first embodiment. FIG. 1B is an enlarged view of the chip Q in FIG. 1A. FIG. 2 is a cross-sectional view showing a semiconductor device SD1a according to a first example of the first embodiment. FIG. 2 is a cross-sectional view taken along line A-A' in FIG. 1B.

The semiconductor device SD1a includes a substrate SUB, a buffer layer BUF, a semiconductor layer SL, a source electrode SE, a drain electrode DE, a gate electrode GE, an interlayer insulating film ILD, a source pad SP, a drain pad DP, and a gate pad GP. The substrate SUB has a first face F1 and a second face F2. The second face F2 faces the first face F1. In the substrate SUB, at least the first face F1 is formed of silicon. The buffer layer BUF is formed of a first group III nitride semiconductor. The buffer layer BUF has a third face F3 and a fourth face F4. The fourth face F4 faces the third face F3. The third face F3 faces the first face F1 of the substrate SUB. The semiconductor layer SL is formed of a second group III nitride semiconductor. The semiconductor layer SL has a fifth face F5 and a sixth face F6. The sixth face F6 faces the fifth face F5. The fifth face F5 faces the first face F1 of the substrate SUB via the buffer layer BUF. The source electrode SE is coupled to the sixth face F6 of the semiconductor layer SL. The drain electrode DE is coupled to the sixth face F6 of the semiconductor layer SL. The gate electrode GE faces the buffer layer BUF via the semiconductor layer SL. The gate electrode GE is formed between the source electrode SE and the drain electrode DE in a plan view. The interlayer insulating film ILD is formed so as to cover the source electrode SE, the drain electrode DE, and the gate electrode GE. The source pad SP is coupled to the source electrode SE. The source pad SP faces the sixth face F6 of the semiconductor layer SL via the interlayer insulating film ILD. The drain pad DP is coupled to the drain electrode DE. The drain pad DP faces the sixth face F6 of the semiconductor layer SL via the interlayer insulating film ILD. The gate pad GP is coupled to the gate electrode GE. The gate pad GP faces the sixth face F6 of the semiconductor layer SL via the interlayer insulating film ILD.

A trench TRC is formed on the sixth face F6 of the semiconductor layer SL. The trench TRC is formed so as to surround the source pad SP, the drain pad DP, and the gate pad GP in a plan view. The trench TRC passes through the semiconductor layer SL and the buffer layer BUF. The bottom of the trench TRC reaches at least the inside of the substrate SUB.

In the semiconductor device SD1a, the semiconductor layer SL is divided by the trench TRC. Therefore, there is divided a region where the stress of the semiconductor layer SL acts on the substrate SUB. In this case, the stress of the semiconductor layer SL acting on the substrate SUB is alleviated.

The semiconductor device SD1a further includes an insulating film IF and a metal film MF. The insulating film IF is formed from the bottom surface of the trench TRC to the side surfaces. The surface of the insulating film IF is formed along the bottom surface and the side surfaces of the trench TRC. The metal film MF is formed inside the insulating film IF in the trench TRC. The metal film MF is formed at least from the substrate SUB to the buffer layer BUF in the height direction of the trench TRC.

The buffer layer BUF may be peeled off from the first face F1 of the substrate SUB. In this case, there is a risk that water enters the interface between the first face F1 of the substrate SUB and the third face F3 of the buffer layer BUF. In the semiconductor device SD1a, the metal film MF is formed at least from the substrate SUB to the buffer layer BUF in the height direction of the trench TRC. Therefore, water is prevented from entering the interface between the first face F1 of the substrate SUB and the third face F3 of the buffer layer BUF.

The details of the semiconductor device SD1a will be described with reference to FIGS. 1A, 1B, and 2. First, the wafer WF will be described. A plurality of chips Q is formed on the surface of the wafer WF (FIG. 1A). The respective chips Q are separated by dicing lines DL. The wafer WF is diced along the dicing lines DL. Therefore, the chips Q are obtained. In the present embodiment, the chips Q are arranged over each lattice point in the wafer WF in a plan view.

The semiconductor device SD1a is a horizontal power transistor. One power transistor is formed in each chip Q. The source pad SP, the drain pad DP, and the gate pad GP are formed on the surface of the chip Q (FIG. 1B). A source voltage, a drain voltage, and a gate voltage of the power transistor are applied to the source pad SP, the drain pad DP, and the gate pad GP, respectively. The source pad SP, the drain pad DP, and the gate pad GP are surrounded by the dicing lines DL in a plan view. In the present embodiment, the gate pad GP, the drain pad DP, and the source pad SP are aligned in this order. One power transistor includes a plurality of transistor cells TC. The transistor cells TC may be arranged over the lattice points in a plan view. The source voltage, the drain voltage, and the gate voltage of the power transistor are applied to the source, the drain, and the gate of the transistor cell TC, via the source pad SP, the drain pad DP, and the gate pad GP, respectively.

The transistor cell TC will be described. The transistor cell TC is a planar MOSFET (Metal-Oxide-Semiconductor Field Effect Transistor). As shown in FIG. 2, the transistor cell TC includes the substrate SUB, the buffer layer BUF, and the semiconductor layer SL. The trench TRC is formed on a surface (the sixth face F6) of the semiconductor layer SL. The dicing line DL is defined by the trench TRC. In the present embodiment, one transistor cell TC is formed in a region between the trenches TRC in the A-A' cross-section. In other examples, the transistor cells TC may be formed in a region sandwiched between the trenches TRC in the A-A' cross-section.

The substrate SUB has the first face F1 and the second face F2. The second face F2 faces the first face F1. At least the first face F1 is formed of silicon. The substrate SUB is typically a silicon substrate. The substrate SUB may be SOI (Silicon on Insulator). When the substrate SUB is an SOI substrate, silicon is formed on the first face F1. In one example, the thickness of the substrate SUB is 200 μm or less.

The buffer layer BUF has the third face F3 and the fourth face F4. The fourth face F4 faces the third face F3. The third face F3 faces the first face F1 of the substrate SUB. The buffer layer BUF is formed of the first group III nitride semiconductor. When the semiconductor layer SL is directly formed over the substrate SUB, lattice mismatch may occur between the first face F1 of the substrate SUB and the semiconductor layer SL (details of the semiconductor layer SL will be described later). Defects and transitions may occur in the semiconductor layer due to the lattice mismatch. The buffer layer BUF is provided in order to suppress the lattice mismatch between the substrate SUB and the semiconductor layer SL. The buffer layer BUF is typically an insulating layer. When the buffer layer BUF is an insulating layer, the potential of the semiconductor layer SL floats. Examples of the first group III nitride semiconductor include aluminum nitride (AlN), aluminum gallium nitride (AlGaN), and gallium nitride (GaN). Specifically, the buffer layer BUF may be alternate layers of one group III nitride semiconductor (for example, AlN) and another group III nitride semiconductor (for example, AlGaN). In this case, a superlattice is formed by the one group III nitride semiconductor and the other group III nitride semiconductor in the buffer layer BUF.

The semiconductor layer SL has the fifth face F5 and the sixth face F6. The sixth face F6 faces the fifth face F5. The fifth face F5 faces the first face F1 of the substrate SUB via the buffer layer BUF. The semiconductor layer SL is formed of the second group III nitride semiconductor. Examples of the second group III nitride semiconductor include gallium nitride (GaN). Impurities (for example, magnesium or silicon) are doped into the semiconductor layer SL. Therefore, the conductivity-type of the semiconductor layer SL is p-type or n-type. In one example, the sum of the thickness of the semiconductor layer SL and the thickness of the buffer layer BUF is 4 μm or more.

In the transistor cell TC, a channel of the MOSFET is formed in the semiconductor layer SL. The transistor cell TC includes a gate insulating film GI, the gate electrode GE, a source region SR, a drain region DR, the source electrode SE, and the drain electrode DE.

The gate insulating film GI is formed on the sixth face F6 of the semiconductor layer SL. The gate insulating film GI is typically formed of silicon nitride (SiN) or aluminum oxide ($Al_2O_3$). The gate electrode GE faces the sixth face F6 of the semiconductor layer SL via the gate insulating film GI. The gate electrode GE is formed of a metal (for example, titanium nitride (TiN) or tungsten (W)). The gate electrode GE is coupled to the gate pad GP (the gate pad GP is not shown in FIG. 2). Therefore, a voltage applied to the gate pad GP is applied to the gate electrode GE.

The source region SR and the drain region DR are formed in the sixth face F6 of the semiconductor layer SL. The source region SR and the drain region DR face each other via the gate electrode GE in a plan view. Impurities (for example, magnesium or silicon) are doped into the source region SR and the drain region DR. The conductivity-type of the source region SR and the drain region DR is opposite to that of the semiconductor layer SL. In the transistor cell TC, when agate voltage is applied to the gate electrode GE, a channel is formed between the source region SR and the drain region DR.

The source electrode SE and the drain electrode DE are coupled to the source region SR and the drain region DR, respectively. The source electrode SE includes a via SV and a wiring SWR. In the same way, the drain electrode DE includes a via DV and wiring DWR. The via SV and the via DV pass through an interlayer insulating film ILD1 (details of the interlayer insulating film ILD1 will be described later) and the gate insulating film GI. The via SV and the via DV are coupled to the source region SR and the drain region DR, respectively. The via SV and the via DV face each other via the gate electrode GE in a plan view. The wiring SWR and the wiring DWR are buried in a trench formed in an interlayer insulating film ILD2 (details of the interlayer insulating film ILD2 will be described later). The source electrode SE and the drain electrode DE are formed of a metal (for example, copper (Cu) or tungsten (W)). The via SV and the wiring SWR are formed by a damascene process. In the same way, the via DV and the wiring DWR are formed by a damascene process. The source electrode SE and the drain electrode DE are coupled to the source pad SP and the drain pad DP, respectively (the source pad SP and the drain pad DP are not shown in FIG. 2). Therefore, the source voltage applied to the source pad SP and the gate voltage applied to the drain pad DP are applied to the source region SR and the drain region DR, respectively, via the source electrode SE and the drain electrode DE.

The interlayer insulating film ILD is formed over the sixth face F6 of the semiconductor layer SL. The interlayer insulating film ILD is formed so as to cover the source electrode SE, the drain electrode. DE, and the gate electrode GE. The interlayer insulating film ILD includes the interlayer insulating film ILD1 and the interlayer insulating film ILD2. The interlayer insulating film ILD2 is formed over the interlayer insulating film ILD1. An insulating film (not shown in the drawings) is formed between the interlayer insulating film ILD1 and the interlayer insulating film ILD2. Each of the interlayer insulating film ILD1 and the interlayer insulating film ILD2 is typically a silicon oxide film ($SiO_2$ film) or a low-κ dielectric constant film. The source pad SP, the drain pad DP, and the gate pad GP face the sixth face F6 of the semiconductor layer SL through the interlayer insulating film ILD.

The trench TRC is formed on the sixth face F6 of the semiconductor layer SL. The trench TRC is formed so as to surround the source pad SP, the drain pad DP, and the gate pad GP in a plan view. The dicing line DL is defined by the trench TRC. In the present embodiment, one trench TRC is formed so as to surround one chip Q in a plan view. In other examples, a number of trenches TRC may be formed so as to surround one chip Q in a plan view. In an example, the width of the trench TRC is 100 nm or more and 2 µm or less. The width of the trench TRC may be gradually reduced from the semiconductor layer SL toward the substrate SUB. The trench TRC passes through the semiconductor layer SL and the buffer layer BUF. The bottom of the trench TRC reaches the inside of the substrate SUB. The distance from the first face F1 of the substrate SUB to the bottom of the trench TRC may be 100 nm or more in the thickness direction of the substrate SUB.

The insulating film IF and the metal film MF are formed inside the trench TRC. The insulating film IF is formed from the bottom surface to the side surfaces of the trench TRC. The surface of the insulating film IF is formed along the bottom surface and the side surfaces of the trench TRC. That is, the whole of the trench TRC is not filled with the insulating film IF. The metal film MF is formed inside the insulating film IF in the trench TRC. The metal film MF is formed from the bottom surface to the side surfaces of the trench TRC. The surface of the metal film MF is formed along the bottom surface and the side surfaces of the trench TRC. Namely, the whole of the trench TRC is not filled with the metal film MF. By the metal film MF, water is prevented from entering the interface between the first face F1 of the substrate SUB and the third face F3 of the buffer layer BUF.

In the semiconductor device SD1a, the gate insulating film GI and the insulating film IF are formed of the same material. Furthermore, the gate insulating film GI and the insulating film IF are continuously formed from the sixth face F6 of the semiconductor layer SL to the side surface of the trench TRC. In the present embodiment, the insulating film constituting the gate insulating film GI and the insulating film IF is formed through the same process as described later. Therefore, the gate insulating film GI and the insulating film IF are continuously formed.

The metal film MF is typically formed of titanium nitride (TiN) or tungsten (W). In the semiconductor device SD1a, the gate electrode GE and the metal film MF may be formed of the same material. In the present embodiment, films constituting the gate electrode GE and the metal film MF are formed through the same process as described later. Therefore, the gate electrode GE and the metal film MF are formed of the same material.

An insulating film TIF is buried in the trench TRC. The insulating film TIF may be the interlayer insulating film ILD1 or may be an insulating film different from the interlayer insulating film ILD1. When the insulating film TIF and the interlayer insulating film ILD1 are insulating films different from each other, an interface between the insulating film TIF and the interlayer insulating film ILD1 is formed between the insulating film TIF and the interlayer insulating film ILD1.

Next, a manufacturing method of the semiconductor device SD1a will be described with reference to FIGS. 3A to 5B. FIGS. 3A to 5B are cross-sectional views showing the manufacturing method of the semiconductor device SD1a.

Figure 3A:
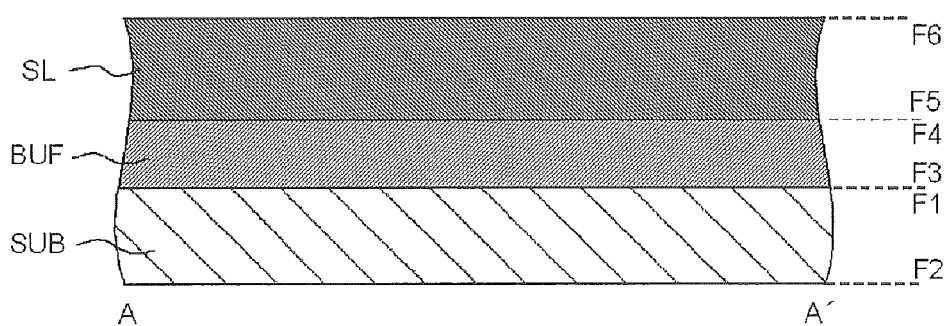
FIGS. 3A and 3B are cross-sectional views showing a manufacturing method of the semiconductor device shown in FIG. 2.

First, the buffer layer BUF is formed over the first face F1 of the substrate SUB. The buffer layer BUF is typically formed by metal organic chemical vapor deposition (MOCVD). Subsequently, the semiconductor layer SL is formed over the fourth face F4 of the buffer layer BUF (FIG. 3A). The semiconductor layer SL is typically formed by epitaxial growth. In the epitaxial growth, impurities (for example, magnesium or silicon) are doped into the semiconductor layer SL so that the conductivity type of the semiconductor layer SL is p-type or n-type.

Figure 3B:
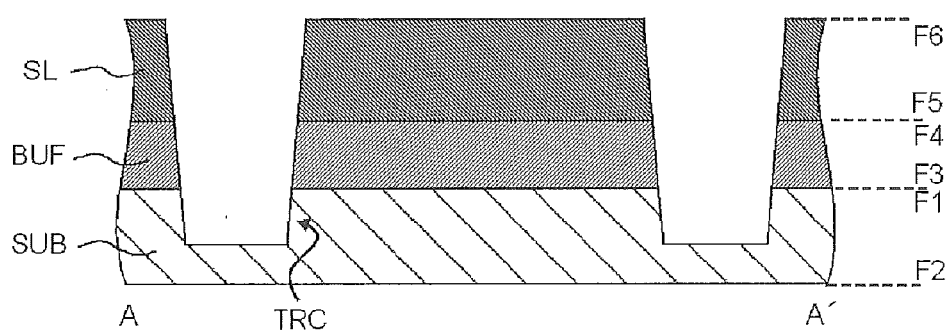

Next, the trench TRC is formed on the sixth face F6 of the semiconductor layer SL (FIG. 3B). The trench TRC is formed by dry etching. In the dry etching, a silicon oxide film ($SiO_2$) is used as a mask. An etchant for the dry etching is typically a chlorine-based gas (for example, chlorine ($Cl_2$) and boron trichloride ($BCl_3$). In the dry etching, not only the semiconductor layer SL and the buffer layer BUF, but also the first face F1 of the substrate SUB is etched. In this way, the distance from the first face F1 of the substrate SUB to the bottom of the trench TRC may be 100 nm or more in the thickness direction of the substrate SUB.

Figure 4A:
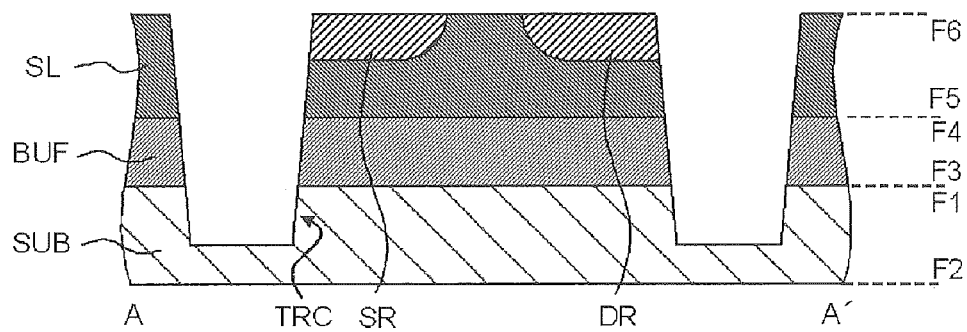
FIGS. 4A and 4B are cross-sectional views showing a manufacturing method of the semiconductor device shown in FIG. 2.

Then, the source region SR and the drain region DR are formed in the sixth face F6 of the semiconductor layer SL (FIG. 4A). In an example, the source region SR and the drain region DR are formed as described below. First, impurities are ion-implanted into the sixth face F6 of the semiconductor layer SL. When the conductivity type of the semiconductor layer SL is p-type, n-type impurities (for example, silicon (Si)) are implanted by the ion implantation. On the other hand, when the conductivity type of the semiconductor layer SL is n-type, p-type impurities (for example, magnesium (Mg)) are implanted by the ion implantation. Subsequently, the semiconductor layer SL is annealed. Therefore, the ion-implanted impurities are activated. In this way, the source region SR and the drain region DR are formed in the sixth face F6 of the semiconductor layer SL.

Figure 4B:
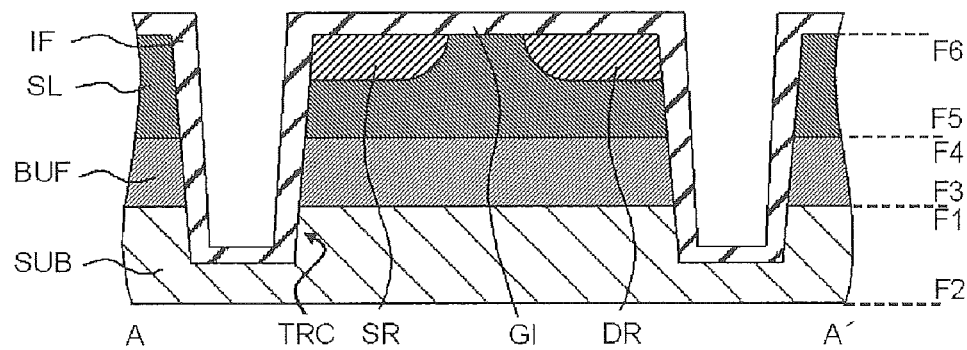

After that, the insulating film IF is formed on the entire sixth face F6 of the semiconductor layer SL (FIG. 4B). As a result, the insulating film IF is not only formed over the sixth face F6 of the semiconductor layer SL, but also formed on the bottom surface and the side surfaces of the trench TRC. Therefore, the insulating film IF is continuously formed from the sixth face F6 of the semiconductor layer SL to the side surface of the trench TRC. The insulating film IF is typically formed by a CVD method. The insulating film IF between the source region SR and the drain region DR in a plan view serves as the gate insulating film GI. Namely, the insulating film constituting the insulating film IF in the trench TRC and the insulating film constituting the gate insulating film GI are formed through the same process.

Figure 5A:
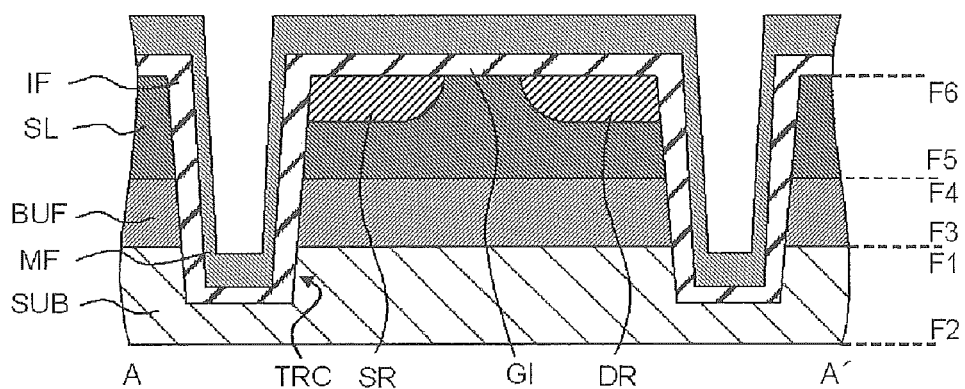
FIGS. 5A and 5B are cross-sectional views showing a manufacturing method of the semiconductor device shown in FIG. 2.

Next, the metal film MF is formed over the entire sixth face F6 of the semiconductor layer SL (FIG. 5A). As a result, the metal film MF is not only formed over the sixth face F6 of the semiconductor layer SL, but also formed on the bottom surface and the side surfaces of the trench TRC. Therefore, the metal film MF is continuously formed from the sixth face F6 of the semiconductor layer SL to the side surface of the trench TRC. The metal film MF is typically formed by sputtering.

Figure 5B:
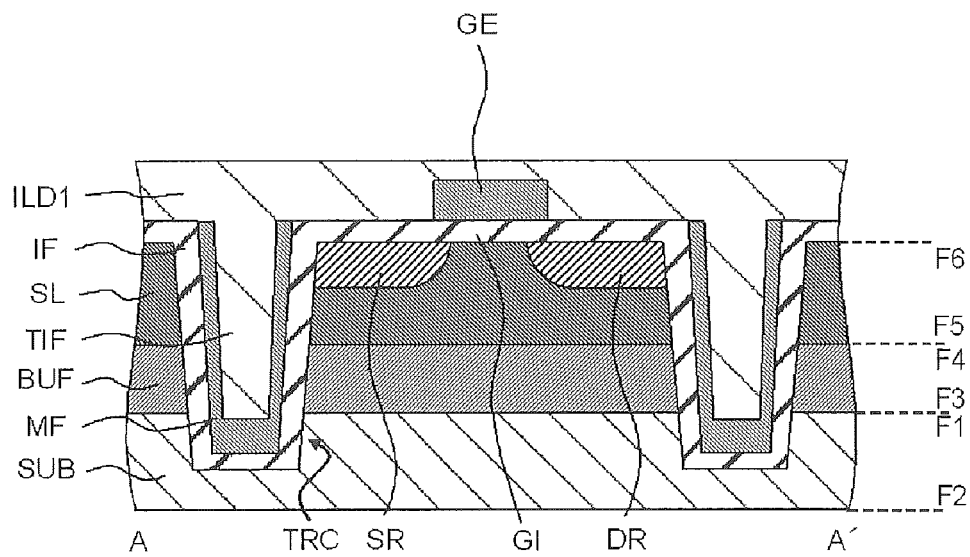

Subsequently, the metal film MF over the sixth face F6 of the semiconductor layer SL is patterned. Therefore, the gate electrode GE is formed over the sixth face F6 of the semiconductor layer SL. In this way, the metal film constituting the metal film MF in the trench TRC and the metal film constituting the gate electrode GE are formed through the same process. As a result, the metal film MF and the gate electrode GE are formed of the same material. Next, the interlayer insulating film ILD1 is formed on the entire sixth face F6 of the semiconductor layer SL (FIG. 5B). As a result, the interlayer insulating film ILD1 is not only formed on the sixth face F6 of the semiconductor layer SL, but also buried in the trench TRC. The interlayer insulating film ILD1 covers the gate electrode GE.

Then, the interlayer insulating film ILD2 is formed over the interlayer insulating film ILD1. Subsequently, the source electrode SE and the drain electrode DE are formed by a damascene process. After that, the drain pad DP, the source pad SP, and the gate pad GP are formed over the interlayer insulating film ILD. In this way, the semiconductor device SD1a is manufactured.

Figure 6:
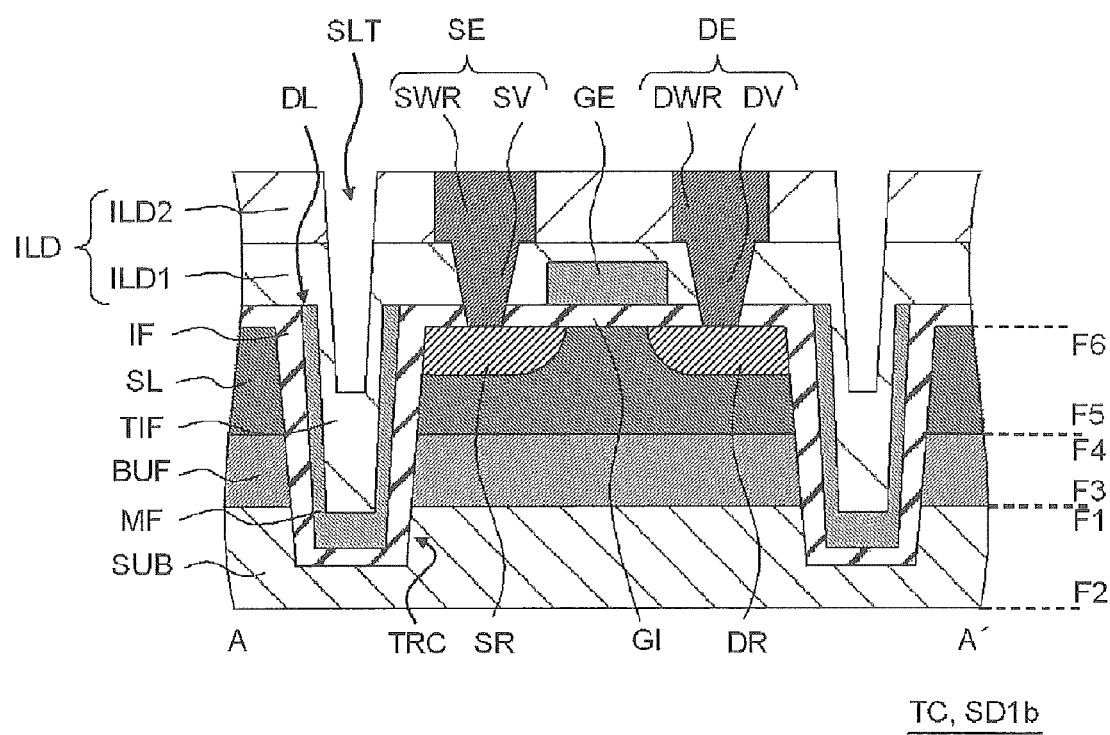
FIG. 6 is a cross-sectional view showing a semiconductor device according to a second example of the first embodiment.

Next, a semiconductor device SD1b according to a second example of the present embodiment will be described with reference to FIG. 6. FIG. 6 is a cross-sectional view showing the semiconductor device SD1b. The semiconductor device SD1b has the same configuration as that of the semiconductor device SD1a except that a slit SLT is formed on the surface of the interlayer insulating film ILD. The slit SLT is formed along the trench TRC in a plan view.

In the semiconductor device SD1b, the slit SLT is formed on the surface of the interlayer insulating film ILD. The slit SLT is formed so as to overlap the trench TRC in a plan view. Namely, the slit SLT is formed so as to surround the chip Q in a plan view. The bottom of the slit SLT may reach the inside of the semiconductor layer SL in the film thickness direction of the semiconductor layer SL. A metal film or an insulating film may be buried in the slit SLT.

Figure 7:
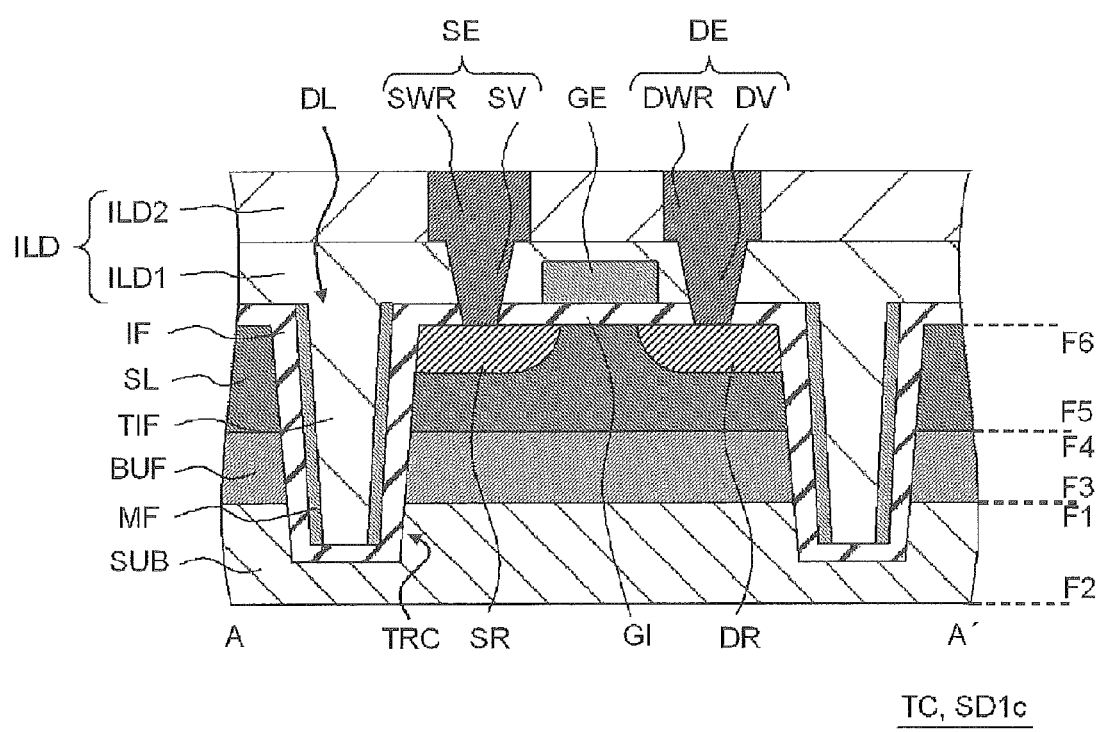
FIG. 7 is a cross-sectional view showing a semiconductor device according to a third example of the first embodiment.

Subsequently, a semiconductor device SD1c according to a third example of the present embodiment will be described with reference to FIG. 7. FIG. 7 is a cross-sectional view showing the semiconductor device SD1c. The semiconductor device SD1c has the same configuration as that of the semiconductor device SD1a except that the metal film MF is formed so as to expose the insulating film IF at the bottom surface of the trench TRC. In the semiconductor device SD1c, even if the metal film MF is not formed at the bottom surface of the trench TRC, the metal film MF is formed on the side surfaces of the trench TRC. Therefore, water is prevented from entering the interface between the first face F1 of the substrate SUB and the third face F3 of the buffer layer BUF.

Figure 8:
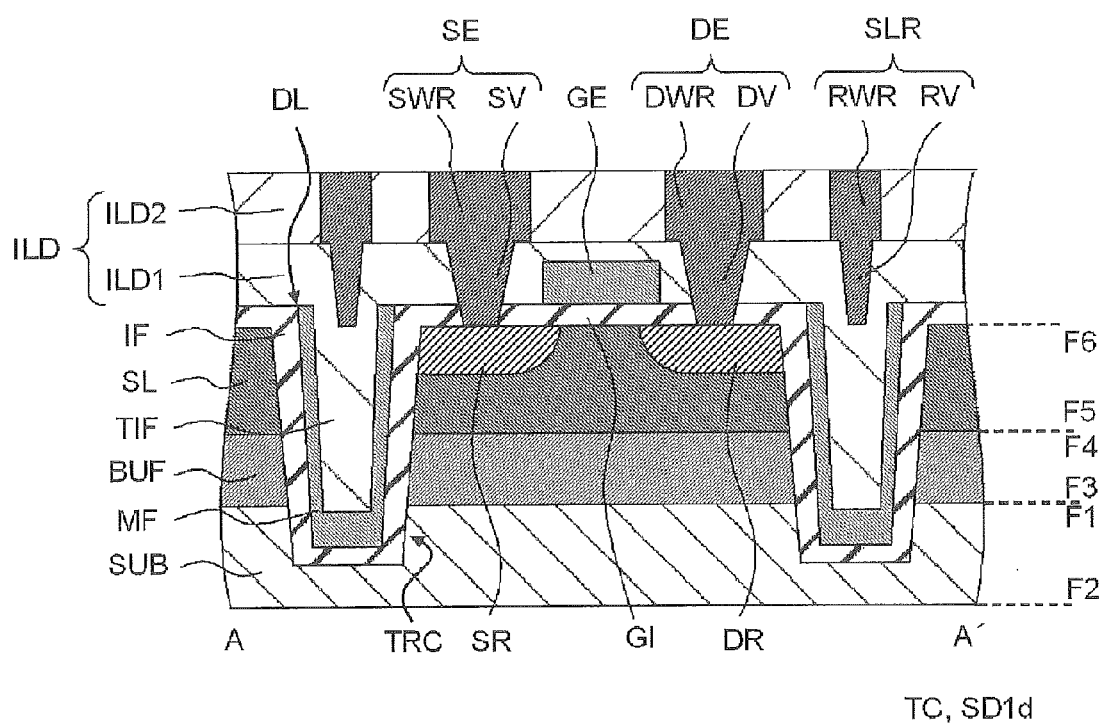
FIG. 8 is a cross-sectional view showing a semiconductor device according to a fourth example of the first embodiment.

Then, a semiconductor device SD1d according to a fourth example of the present embodiment will be described with reference to FIG. 8. FIG. 8 is a cross-sectional view showing the semiconductor device SD1d. The semiconductor device SD1d has the same configuration as that of the semiconductor device SD1a except that a seal ring SLR is buried in the interlayer insulating film ILD. The seal ring SLR is formed along the trench TRC in a plan view.

In the semiconductor device SD1d, the seal ring SLR is buried in the interlayer insulating film ILD. The seal ring SLR is formed so as to overlap the trench TRC in a plan view. Namely, the seal ring SLR is formed so as to surround the chip Q in a plan view. The seal ring SLR is formed of a metal (for example, copper or tungsten). The seal ring SLR includes a via RV and a wiring RWR. The seal ring SLR is formed through the same process as that of the source electrode SE and the drain electrode DE. In this case, the seal ring SLR is formed of the same material as that of the source electrode SE and the drain electrode DE. The seal ring SLR is typically formed by the damascene process in the same way as the source electrode SE and the drain electrode DE.

Figure 9:
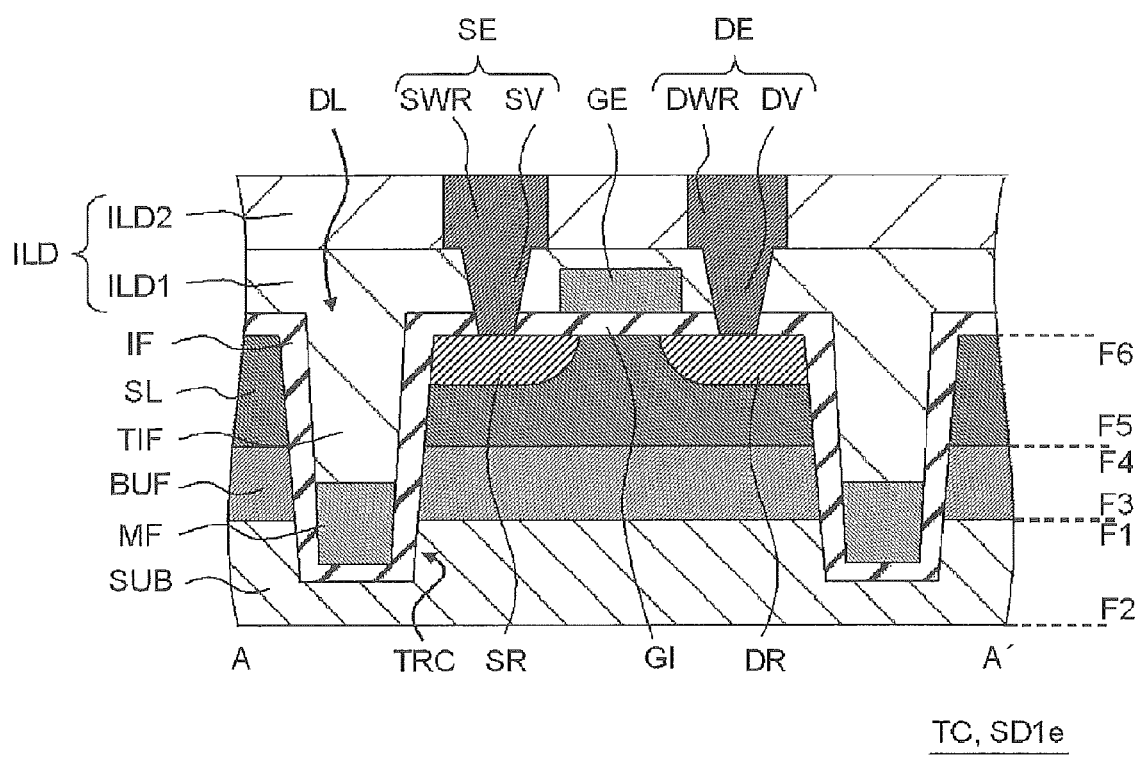
FIG. 9 is a cross-sectional view showing a semiconductor device according to a fifth example of the first embodiment.

Next, a semiconductor device SD1e according to a fifth example of the present embodiment will be described with reference to FIG. 9. FIG. 9 is a cross-sectional view showing the semiconductor device SD1e. The semiconductor device SD1e has the same configuration as that of the semiconductor device SD1a except that the metal film MF is formed so as to fill the bottom portion of the trench TRC.

In the semiconductor device SD1e, the metal film MF is not formed in the upper portion of the trench TRC. On the other hand, the metal film MF is buried in the trench TRC at least from the substrate SUB to the buffer layer BUF in the height direction of the trench TRC. In this case, even if the metal film MF is not formed in the upper portion of the trench TRC, water is prevented from entering the interface between the first face F1 of the substrate SUB and the third face F3 of the buffer layer BUF. In the same way as the semiconductor device SD1d, the semiconductor device SD1e may include the seal ring SLR.

Figure 10:
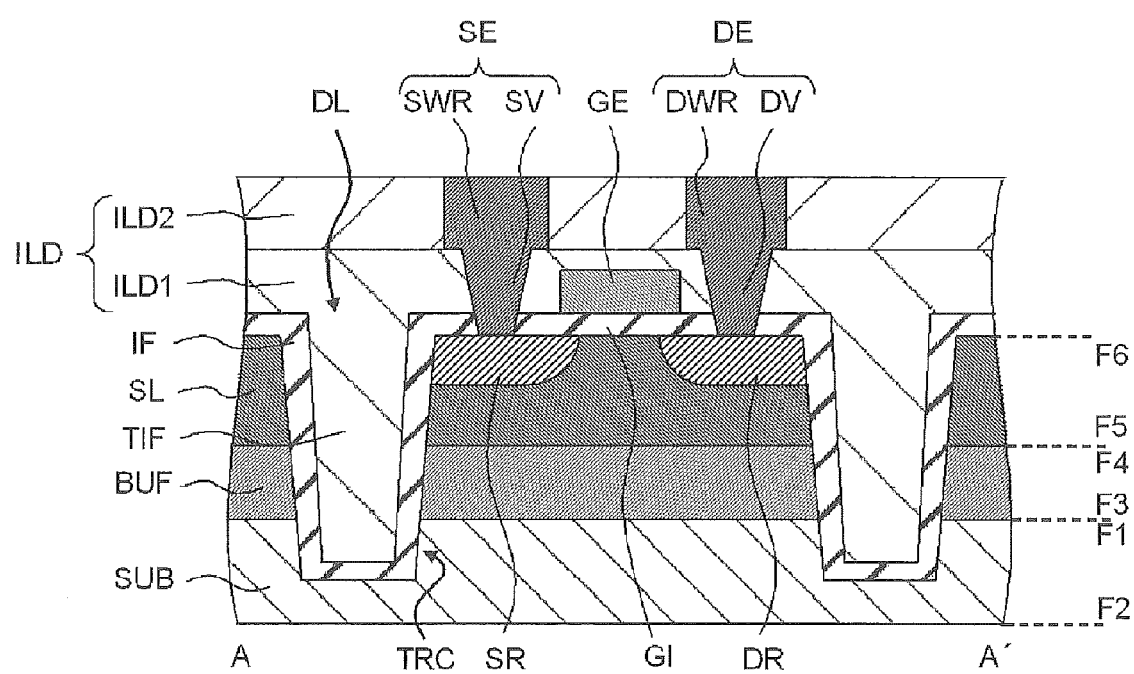
FIG. 10 is a cross-sectional view showing a semiconductor device according to a sixth example of the first embodiment.

Next, a semiconductor device SD1f according to a sixth example of the present embodiment will be described with reference to FIG. 10. FIG. 10 is a cross-sectional view showing the semiconductor device SD1f. The semiconductor device SD1f has the same configuration as that of the semiconductor device SD1a except that the metal film MF is not formed in the trench TRC. In the semiconductor device SD1f, the metal film MF is not formed inside the trench TRC. On the other hand, the bottom of the trench TRC reaches at least the inside of the substrate SUB in the same way as the semiconductor device SD1a. In this way, in the semiconductor device SD1f, the semiconductor layer SL is divided by the trench TRC. Therefore, there is divided a region where stress of the semiconductor layer SL acting on the substrate SUB. In this way, the stress of the semiconductor layer SL acting on the substrate SUB is alleviated.

Figure 11:
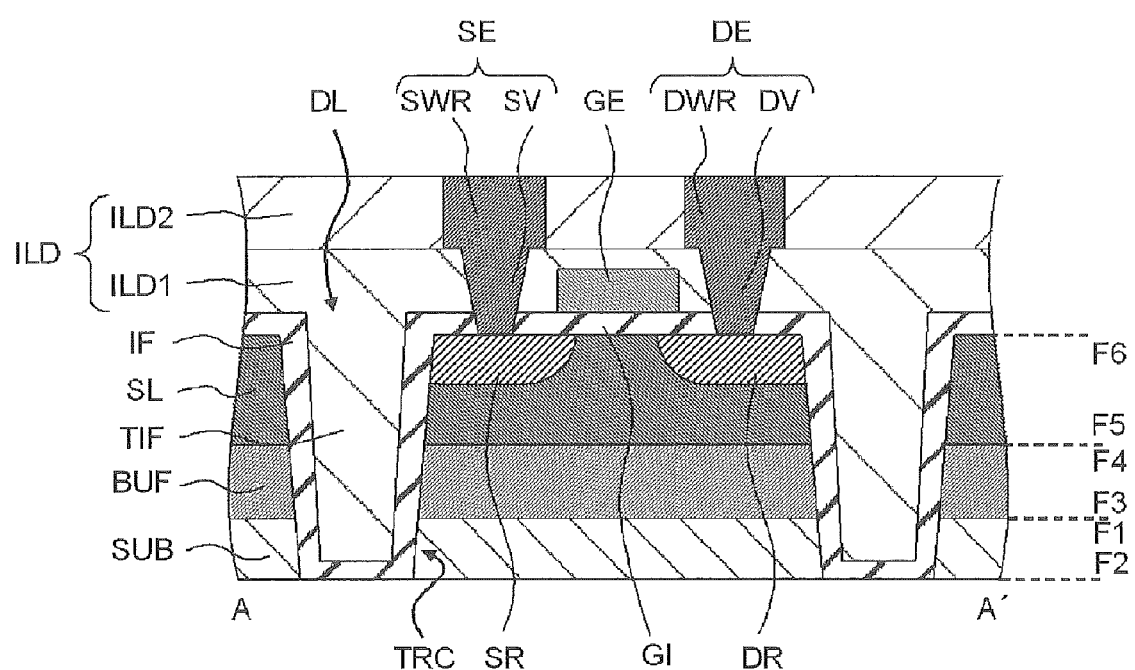
FIG. 11 is a cross-sectional view showing a semiconductor device according to a seventh example of the first embodiment.

Next, a semiconductor device SD1g according to a seventh example of the present embodiment will be described with reference to FIG. 11. FIG. 11 is a cross-sectional view showing the semiconductor device SD1g. The semiconductor device SD1g has the same configuration as that of the semiconductor device SD1f except that the trench TRC passes through the substrate SUB. In the semiconductor device SD1g, the position of the trench TRC can be checked from the second face F2 of the substrate SUB.

In the semiconductor device SD1g, the trench TRC passes through not only the semiconductor layer SL and the buffer layer BUF, but also the substrate SUB. In the same way as the semiconductor device SD1f, the semiconductor device SD1g may not include the metal film MF inside the trench TRC. In the same way as the semiconductor devices SD1a to SD1e, the semiconductor device SD1g may include the metal film MF inside the trench TRC.

The manufacturing method of the semiconductor device SD1g is the same as that of the semiconductor device SD1a except that the second face F2 of the substrate SUB is polished after the insulating film TIF is buried in the trench TRC. In the manufacturing method of the semiconductor device SD1g, the position of the bottom of the trench TRC may be substantially the same as the position of the second face F2 of the substrate SUB in the process in which the trench TRC is formed (the process shown in FIG. 3B). The "substantially" means that the trench TRC does not pass through the substrate SUB. In this case, the second face F2 of the substrate SUB is polished after the insulating film TIF is buried in the trench TRC. As a result, the trench TRC passes through the substrate SUB. In the manufacturing method of the semiconductor device SD1g, the position of the trench TRC can be checked from the second face F2 of the substrate SUB in the polishing process of the second face F2 of the substrate SUB.

In the present embodiment, the semiconductor layer SL is divided by the trench TRC. Therefore, there is divided the region where stress of the semiconductor layer SL acts on the substrate SUB. In this way, the stress of the semiconductor layer SL acting on the substrate SUB is alleviated. Furthermore, in the present embodiment, the metal film MF may be formed inside the trench TRC. By the metal film MF, water is prevented from entering the interface between the first face F1 of the substrate SUB and the third face F3 of the buffer layer BUF.

Second Embodiment

Figure 12:
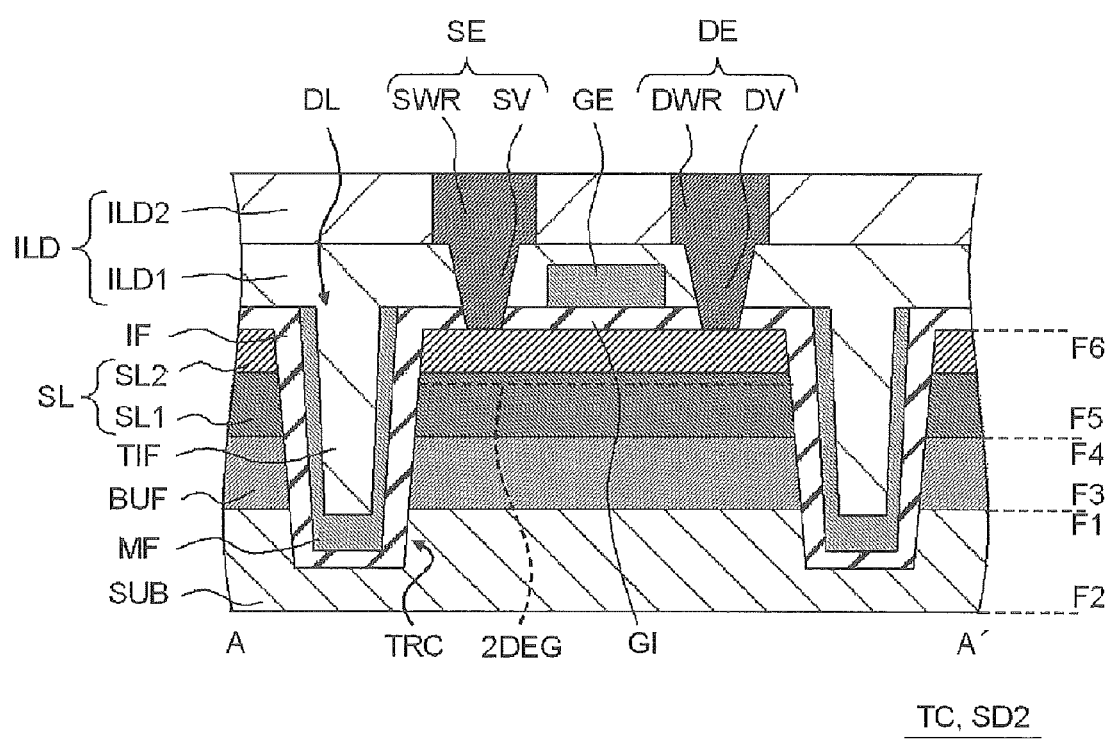
FIG. 12 is a cross-sectional view showing a semiconductor device according to a second embodiment.

FIG. 12 is a cross-sectional view showing a semiconductor device SD2 according to a second embodiment. The semiconductor device SD2 has the same configuration as that of the semiconductor device SD1a except that the transistor cell TC is a high electron mobility transistor (HEMT). The dicing line DL (the trench TRC) of the first embodiment can be applied not only to the MOSFET, but also to the HEMT.

The semiconductor device SD2 will be described in detail with reference to FIG. 12. As shown in FIG. 12, the transistor cell TC (the semiconductor device SD2) includes the substrate SUB, the buffer layer BUF, and the semiconductor layer SL. The trench TRC is formed on a surface (the sixth face F6) of the semiconductor layer SL. The transistor cell TC of the present embodiment has the same configuration as that of the transistor cell TC of the first embodiment except for the semiconductor layer SL.

In the semiconductor device SD2, the semiconductor layer SL includes the semiconductor layer SL1 and the semiconductor layer SL2. The semiconductor layer SL2 is formed over the semiconductor layer SL1. The semiconductor layer SL1 and the semiconductor layer SL2 forms a heterojunction at an interface between the semiconductor layer SL1 and the semiconductor layer SL2. In the semiconductor layer SL1, a two-dimensional electron gas (2 DEG) is generated by the heterojunction. The semiconductor layer SL1 and the semiconductor layer SL2 are formed of a group III nitride semiconductor. In one example, the semiconductor layer SL1 is formed of gallium nitride (GaN). In this case, the semiconductor layer SL2 is formed of aluminum gallium nitride (AlGaN).

Subsequently, a manufacturing method of the semiconductor device SD2 will be described with reference to FIGS. 13A to 14B. FIGS. 13A to 14B are cross-sectional views showing the manufacturing method of the semiconductor device SD2.

Figure 13A:
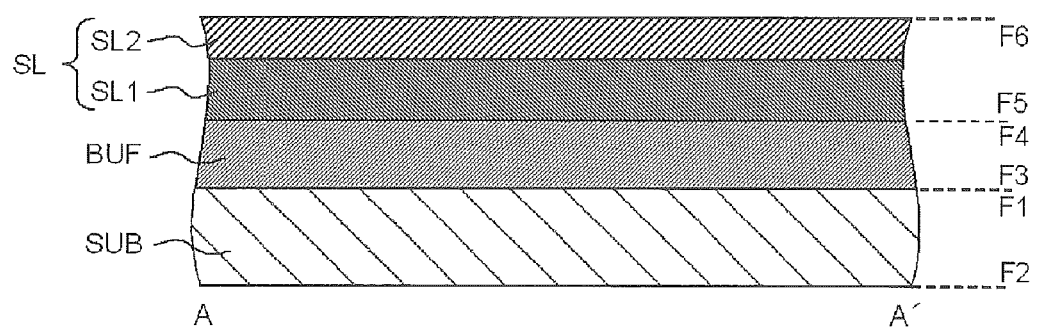
FIGS. 13A and 13B are cross-sectional views showing a manufacturing method of the semiconductor device shown in FIG. 12.

First, the buffer layer BUF is formed over the first face F1 of the substrate SUB in the same way as in the first embodiment. Next, the semiconductor layer SL1 is formed over the fourth face F4 of the buffer layer BUF. The semiconductor layer SL1 is typically formed by epitaxial growth. Then, the semiconductor layer SL2 is formed over the semiconductor layer SL1 (FIG. 13A). The semiconductor layer SL2 is typically formed by epitaxial growth.

Figure 13B:
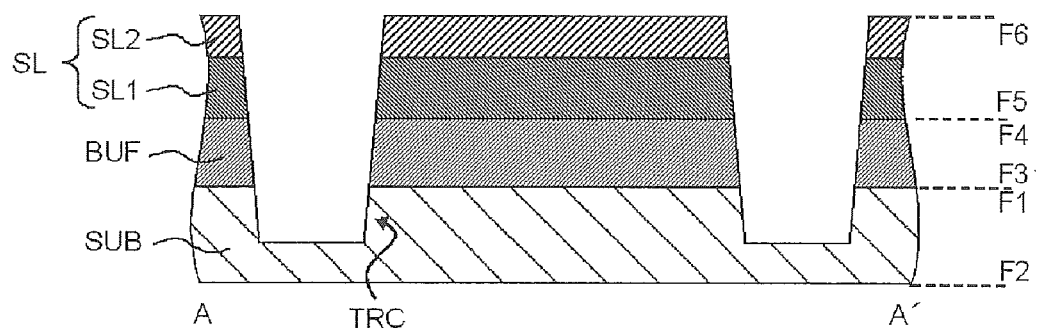

After that, the trench TRC is formed on the sixth face F6 of the semiconductor layer SL in the same way as in the first embodiment (FIG. 13B). The trench TRC passes through the semiconductor layer SL2, the semiconductor layer SL1, and the buffer layer BUF. The bottom of the trench TRC reaches at least the inside of the substrate SUB.

Figure 14A:
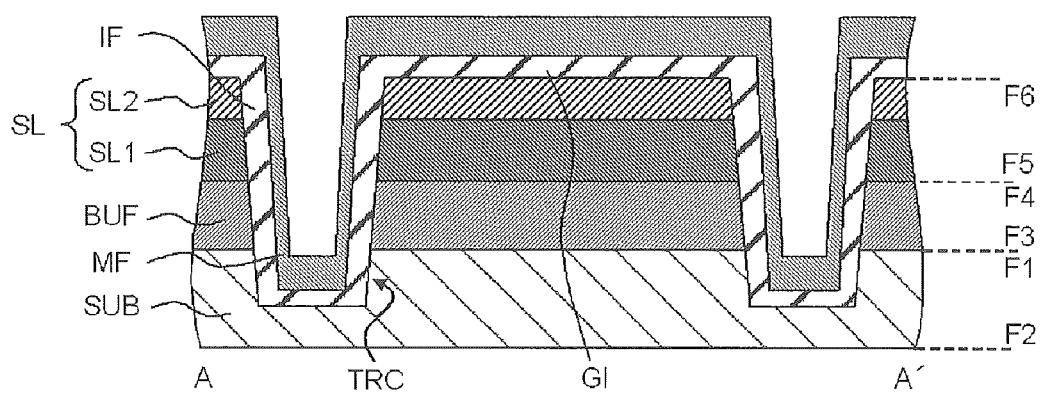
FIGS. 14A and 14B are cross-sectional views showing a manufacturing method of the semiconductor device shown in FIG. 12.
Figure 14B:
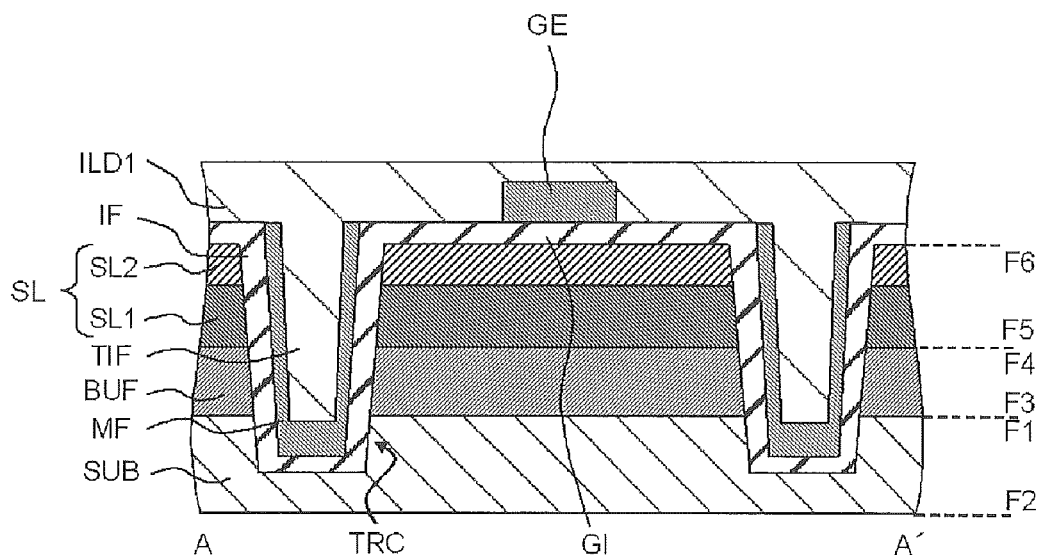

Subsequently, the insulating film IF and the metal film MF are formed in the same way as in the first embodiment (FIG. 14A). Subsequently, the metal film MF is patterned. Therefore, the gate electrode GE is formed over the sixth face F6 of the semiconductor layer SL. Next, the interlayer insulating film ILD is formed (FIG. 14B). Then, the interlayer insulating film ILD2, the source electrode SE, and the drain electrode DE are formed in the same way as in the first embodiment. After that, the drain pad DP, the source pad SP, and the gate pad GP are formed over the interlayer insulating film ILD. In this way, the semiconductor device SD2 is manufactured.

Third Embodiment

Figure 15A:
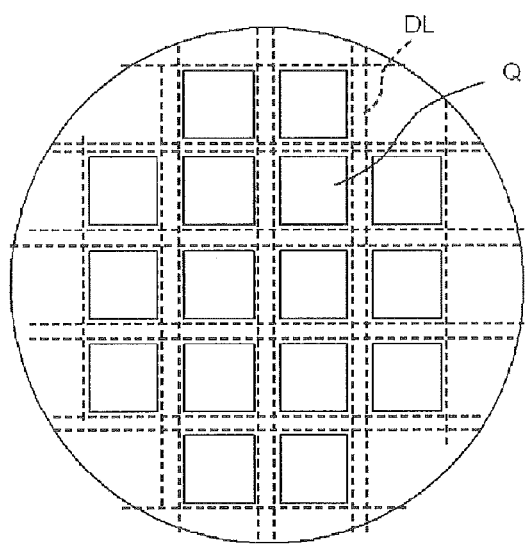
FIG. 15A is a plan view showing a wafer according to a third embodiment.
Figure 15B:
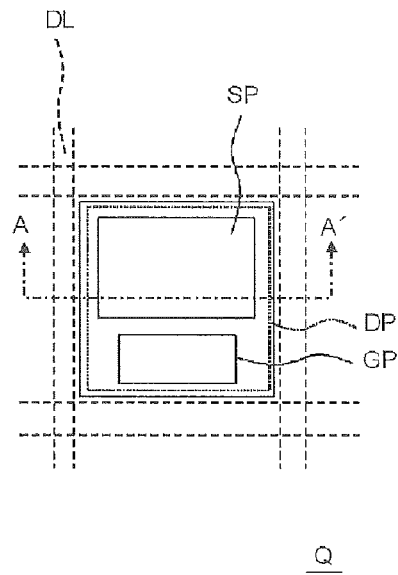
FIG. 15B is a plan view showing a chip according to the third embodiment.
Figure 16:
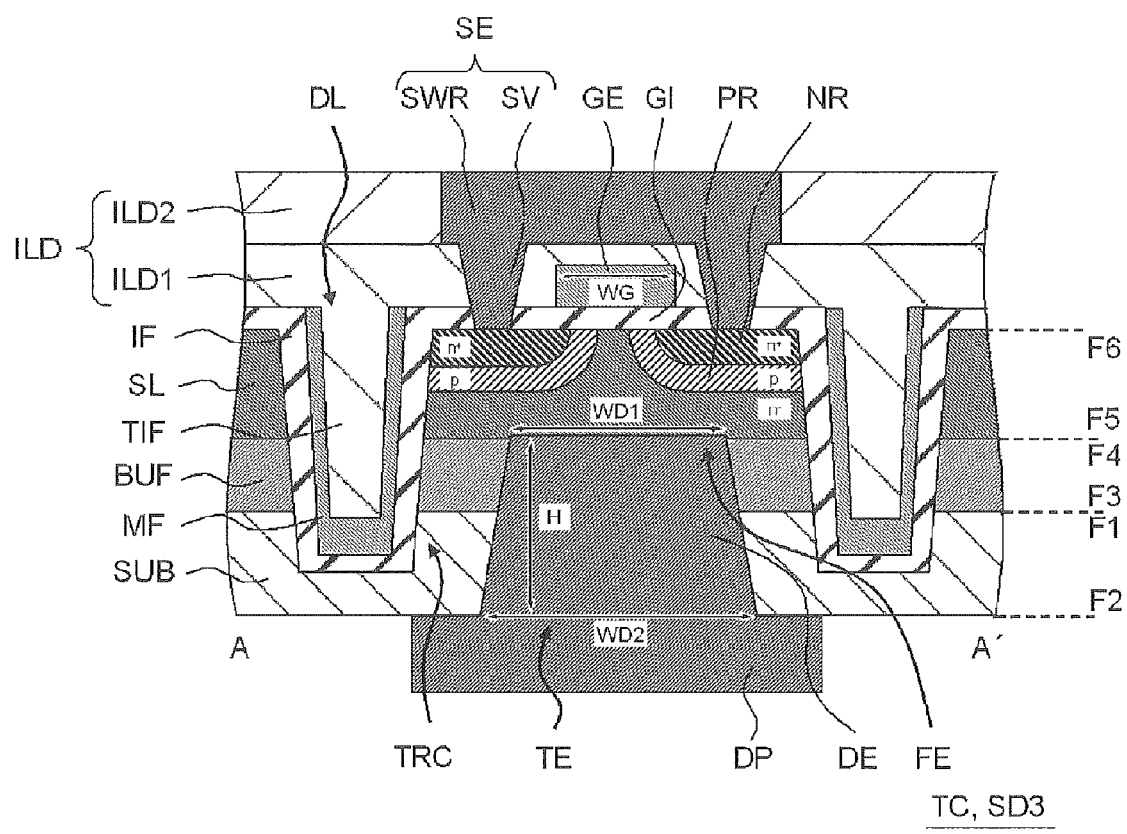
FIG. 16 is a cross-sectional view showing a semiconductor device according to the third embodiment.

FIG. 15A is a plan view showing a wafer WF according to a third embodiment. FIG. 15B is a plan view showing a chip Q according to the third embodiment. FIG. 15B is an enlarged view of the chip Q in FIG. 15A. FIG. 16 is a cross-sectional view showing a semiconductor device SD3 according to the third embodiment. FIG. 16 is a cross-sectional view taken along line A-A' in FIG. 15B. While the semiconductor devices of the first and second embodiments are horizontal power transistors, the semiconductor device SD3 is a vertical power transistor. The semiconductor device SD3 has the same configuration as those of the semiconductor devices of the first and the second embodiments except for that described above.

In the present embodiment, the chip Q is arranged in the wafer WF in the same way as in the first embodiment (FIG. 15A). The semiconductor device SD3 is a vertical power transistor. One power transistor is formed in each chip Q. The source pad SP and the gate pad GP are formed over one surface of the chip Q. The drain pad DP is formed over the other surface of the chip Q (FIG. 15B). Namely, the drain pad DP faces the source pad SP and the gate pad GP in the thickness direction of the chip Q. The source voltage, the drain voltage, and the gate voltage of the power transistor are applied to the source pad SP, the drain pad DP, and the gate pad GP, respectively, in the same way as in the first and the second embodiments.

In the present embodiment, one power transistor includes a plurality of transistor cells TC in the same way as in the first and the second embodiments. The transistor cell TC of the present embodiment is DMOSFET (Double-Diffused MOSFET) (FIG. 16). The transistor cell TC (the semiconductor device SD3) of the present embodiment includes the substrate SUB, the buffer layer BUF, the semiconductor layer SL, the source electrode SE, the drain electrode DE, the gate electrode GE, the interlayer insulating film ILD, the source pad SP, the drain pad DP, and the gate pad GP in the same way as in the first and the second embodiments.

The transistor cell TC of the present embodiment has the same configuration as those of the transistor cells TC of the first and the second embodiments except that described below. In the present embodiment, the semiconductor layer SL is formed of a first conductivity-type (n-type) group III nitride semiconductor. A p-type region PR (a second conductivity-type region) is formed on the sixth face F6 of the semiconductor layer SL. At least a part of the p-type region PR overlaps the gate electrode GE in a plan view. An n-type region NR (the first conductivity-type region) is formed on the surface of the p-type region PR. The n-type region NR is formed at the side part of the gate electrode GE in a plan view. The source electrode SE is coupled to the n-type region NR. The drain pad DP is formed on the second face F2 of the substrate SUB. Furthermore, the drain pad DP faces the semiconductor layer SL via the substrate SUB and the buffer layer BUF. The drain electrode DE (a drain projection electrode) is coupled the drain pad DP. Moreover, the drain electrode DE passes through the substrate SUB and the buffer layer BUF and is coupled to the fifth face F5 of the semiconductor layer SL. A front end FE of the drain electrode DE has a width larger than that of the gate electrode GE in a direction perpendicular to the extending direction of the gate electrode GE.

In the present embodiment, the drain electrode DE passes through the substrate SUB and the buffer layer BUF. In this way, the vertical power transistor is realized.

Next, the details of the semiconductor device SD3 will be described. In the present embodiment, the first conductivity type is n-type and the second conductivity type is p-type. In other examples, the first conductivity type may be p-type and the second conductivity type may be n-type.

The semiconductor layer SL will be described. The semiconductor layer SL is formed of an $n^-$-type group III nitride semiconductor. The group III nitride semiconductor is typically gallium nitride (GaN). The gate insulating film GI is formed over the sixth face F6 of the semiconductor layer SL. The gate electrode GE is formed over the gate insulating film GI. The gate electrode GE faces the sixth face F6 of the semiconductor layer SL via the gate insulating film GI. The p-type region PR is formed in the sixth face F6 of the semiconductor layer SL. The p-type region PR is divided via the gate electrode GE in a plan view. The n-type region NR is formed on the surface of each divided p-type region PR. The impurity concentration of the n-type region NR is higher than that of the semiconductor layer SL. Apart of the p-type region PR overlaps the gate electrode GE in a plan view. The n-type region NR is formed at the side part of the gate electrode GE in a plan view. The depth of the n-type region NR is shallower than that of the p-type region PR.

The source electrode SE will be described. The source electrode SE is coupled to the n-type regions NR separated via the gate electrode GE in a plan view. The source electrode SE includes the via SV and the wiring SWR. The via SV passes through the interlayer insulating film ILD1 and the gate insulating film GI. In this way, the vias SV reach each of the n-type regions NR separated from each other. These vias SV are coupled to each other through the wiring SWR. Therefore, the n-type regions NR separated from each other have the same potential.

The drain pad DP and the drain electrode DE will be described with reference to FIGS. 16 and 17. FIG. 17 is a plan view showing the gate electrode GE and the drain electrode DE of the semiconductor device SD3. In the present embodiment, the y axis direction is the extending direction of the gate electrode GE. The x axis direction is a direction perpendicular to the y axis direction in a plan view (FIG. 17).

The drain pad DP is formed on the second face F2 of the substrate SUB. The drain pad DP faces the semiconductor layer SL via the substrate SUB and the buffer layer BUF. The drain electrode DE is coupled to the drain pad DP. The drain electrode DE passes through the substrate SUB and the buffer layer BUF and is coupled to the fifth face F5 of the semiconductor layer SL. The width WD1 of the front end FE of the drain electrode DE is greater than the width WG of the gate electrode GE in the x axis direction. Furthermore, the gate electrode GE is formed so as to be located inside the front end FE of the drain electrode DE in a plan view in the x axis direction. In the present embodiment, the center of the gate electrode GE and the center of the drain electrode DE substantially coincide with each other in the x axis direction.

In the present embodiment, the width of the drain electrode DE is wide. Specifically, H/WD2≤2.0 is satisfied. Here, H is the height of the drain electrode DE. The height of the drain electrode DE is defined by the distance from the tail end TE to the front end FE of the drain electrode DE. The tail end TE of the drain electrode DE is at the same level as the second face F2 of the substrate SUB. WD2 is the width of the drain electrode DE at the second face F2 of the substrate SUB.

In the present embodiment, the width of the drain electrode DE is gradually reduced from the substrate SUB toward the semiconductor layer SL. In this case, the width of the drain electrode DE may be monotonically reduced. Alternatively, the width of the drain electrode DE may be reduced in a stepwise manner.

Figure 18A:
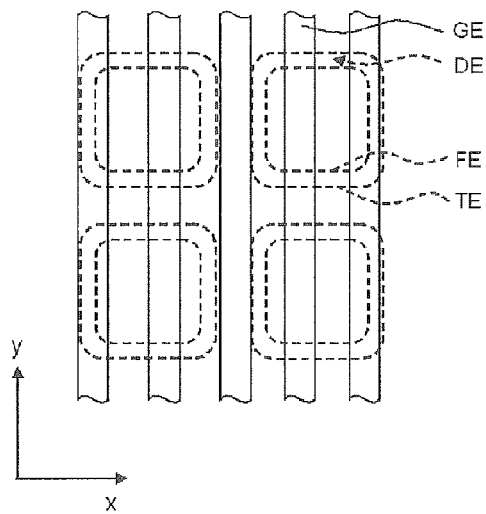
FIG. 18A shows a first detailed example of arrangement of the gate electrode and the drain electrode.
Figure 18B:
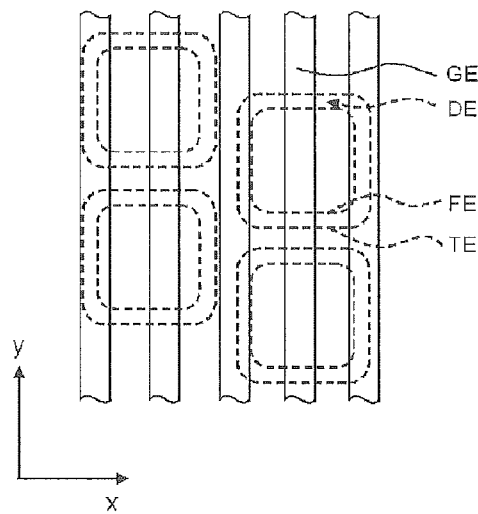
FIG. 18B shows a second detailed example of arrangement of the gate electrode and the drain electrode.

The details of the arrangement of the gate electrode GE and the drain electrode DE will be described with reference to FIGS. 18A and 18B. FIG. 18A shows a first detailed example of the arrangement of the gate electrode GE and the drain electrode DE. FIG. 18B shows a second detailed example of the arrangement of the gate electrode GE and the drain electrode DE.

The number of gate electrodes GE arranged in the x axis direction is not limited to 1. A plurality of gate electrodes GE may be substantially periodically arranged in the x axis direction. The number of drain electrodes DE arranged in the x axis direction is not limited to 1. A plurality of drain electrodes DE may be substantially periodically arranged in the x axis direction. At the same time, the number of drain electrodes DE arranged in the y axis direction is not limited to 1. The drain electrodes DE may be substantially periodically arranged in the y axis direction. When the gate electrodes GE and the drain electrodes DE are arranged in the x axis direction, the front end FE of each drain electrode DE is located inside a predetermined region in the x axis direction. The predetermined region is a region combining regions overlapping the gate electrodes GE, in a plan view, arranged in the x axis direction and regions sandwiched between the gate electrodes GE arranged in the x axis direction.

In FIG. 18A, the front end FE of each drain electrode DE has substantially the same area and the tail end TE of each drain electrode DE has substantially the same area. In FIG. 18A, the centers of the drain electrodes DE are located on substantially the same straight line in the x axis direction. At the same time, the centers of the drain electrodes DE are located on substantially the same straight line in the y axis direction. The gate electrode GE and the drain electrode DE shown in FIG. 18A are formed inside one chip Q.

In FIG. 18B, the front end FE of each drain electrode DE has substantially the same area and the tail end TE of each drain electrode DE has substantially the same area. In FIG. 18B, the centers of the drain electrodes DE are located on substantially the same straight line in the y axis direction. In contrast to this, the centers of the drain electrodes DE adjacent to each other in the x axis direction are shifted in the y axis direction. The gate electrode GE and the drain electrode DE shown in FIG. 18B are formed inside one chip Q.

Next, a manufacturing method of the semiconductor device SD3 will be described with reference to FIGS. 19A to 21B. FIGS. 19A to 21B are cross-sectional views showing the manufacturing method of the semiconductor device SD3.

Figure 19A:
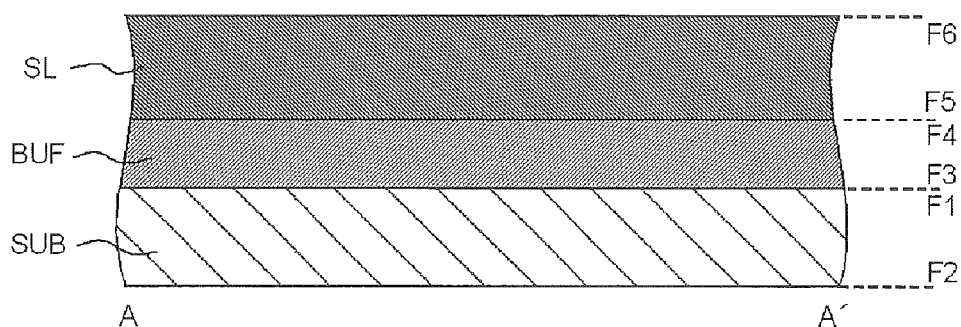
FIGS. 19A and 19B are cross-sectional views showing a manufacturing method of the semiconductor device shown in FIG. 16.
Figure 19B:
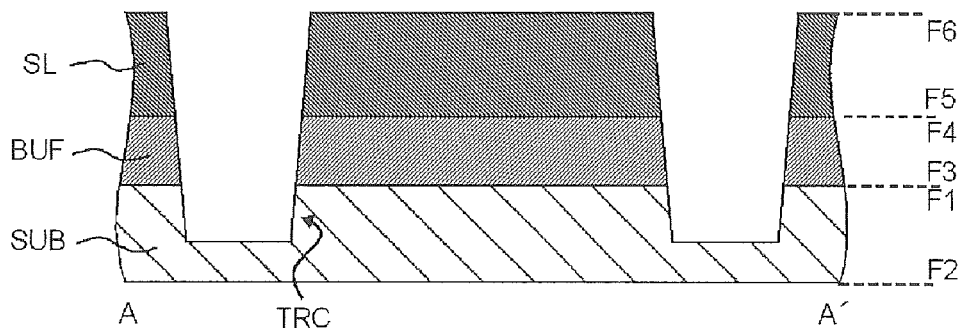
Figure 20A:
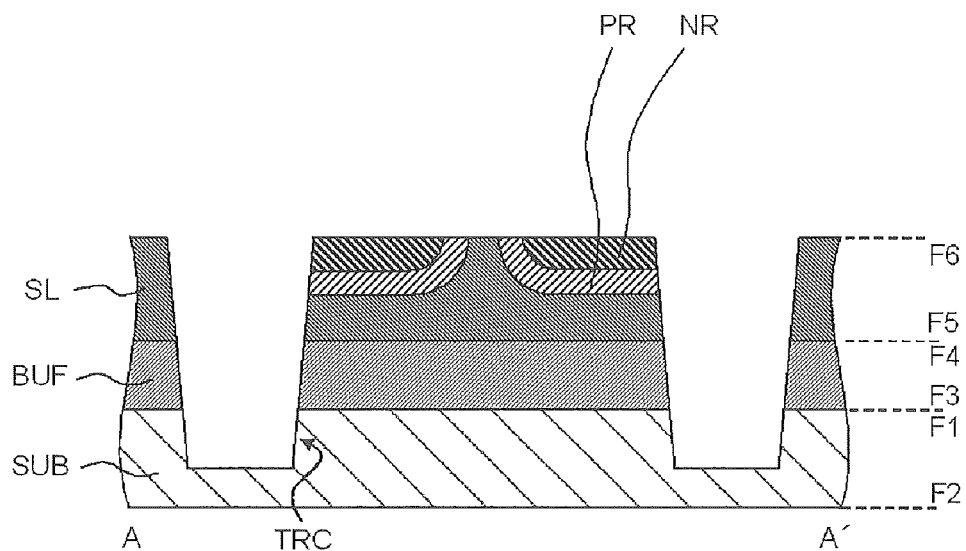
FIGS. 20A and 20B are cross-sectional views showing a manufacturing method of the semiconductor device shown in FIG. 16.

First, the buffer layer BUF and the semiconductor layer SL are formed over the substrate SUB in the same way as in the first embodiment (FIG. 19A). Next, the trench TRC is formed in the same way as in the first embodiment (FIG. 19B). Subsequently, p-type impurities (for example, magnesium) are ion-implanted into the sixth face F6 of the semiconductor layer SL. Subsequently, n-type impurities (for example, silicon) are ion-implanted into the sixth face F6 of the semiconductor layer SL. Then, the semiconductor layer SL is annealed. Therefore, the ion-implanted impurities are activated. In this way, the p-type regions PR and the n-type regions NR are formed in the sixth face F6 of the semiconductor layer SL (FIG. 20A).

Figure 20B:
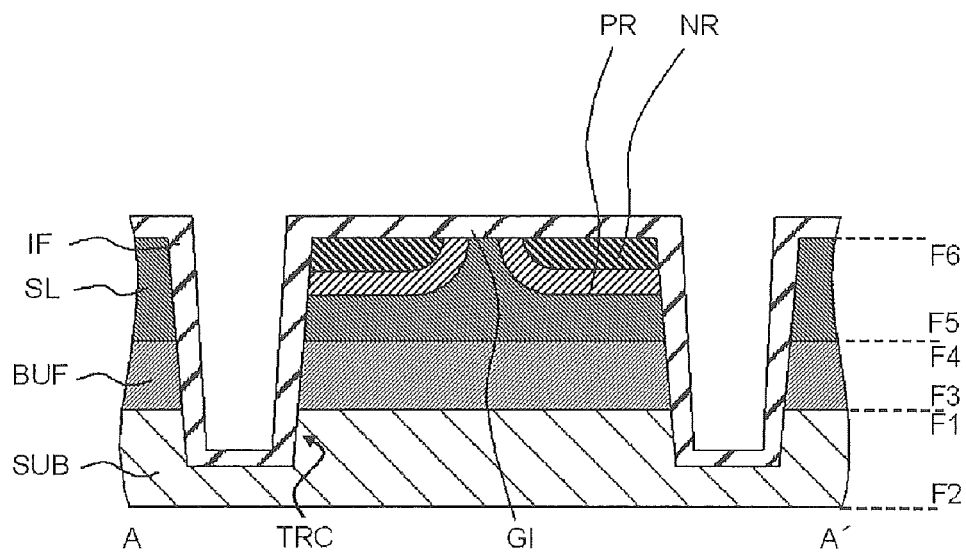
Figure 21A:
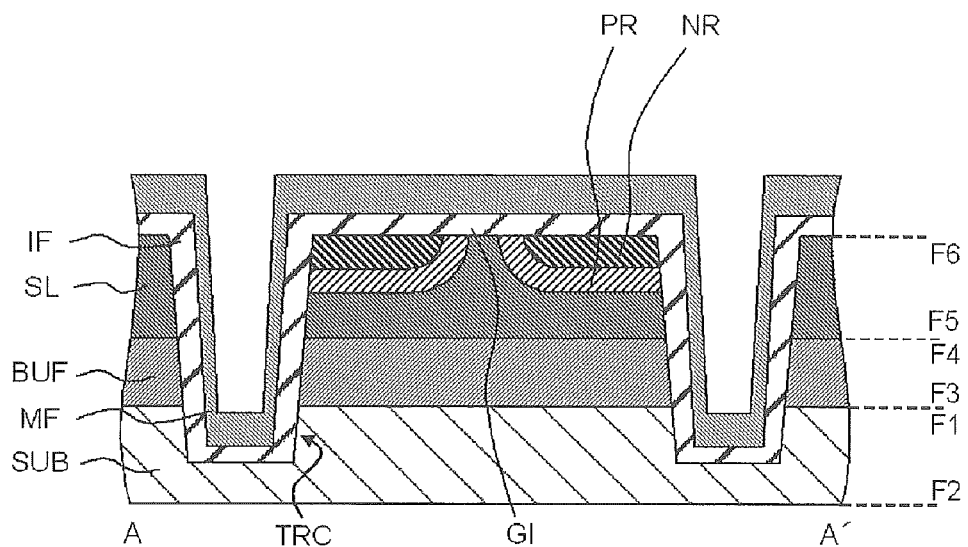
FIGS. 21A and 21B are cross-sectional views showing a manufacturing method of the semiconductor device shown in FIG. 16.
Figure 21B:
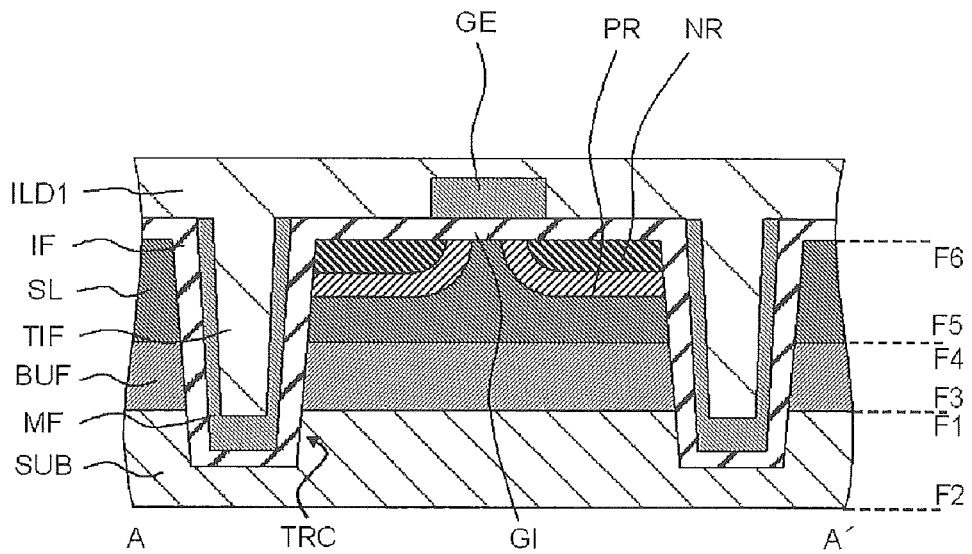

Next, the insulating film IF is formed in the same way as in the first embodiment (FIG. 20B). Subsequently, the metal film MF is formed in the same way as in the first embodiment (FIG. 21A). Then, the gate electrode GE is formed in the same way as in the first embodiment. Next, the interlayer insulating film ILD1 is formed in the same way as in the first embodiment (FIG. 21B). After that, the interlayer insulating film ILD2 and the source electrode SE are formed in the same way as in the first embodiment.

Then, the second face F2 of the substrate SUB is polished so that the thickness of the substrate SUB is 200 µm or less. Subsequently, the drain electrode DE is formed. The drain electrode DE is formed by using a technique of TSV (Through-Silicon Via). Specifically, a through-hole (not shown in the drawings) is formed from the second face F2 of the substrate SUB to the fourth face F4 of the buffer layer BUF. The through-hole is formed by dry etching in the same way as the formation of the trench TRC. Subsequently, a polycrystalline silicon film is deposited on the second face F2 of the substrate SUB. In this case, the polycrystalline silicon film is buried in the through-hole. In this way, the drain electrode DE is formed. After that, the polycrystalline silicon film on the second face F2 of the substrate SUB is patterned. Therefore, the drain pad DP is formed over the second face F2 of the substrate SUB. When the drain electrode DE and the drain pad DP are formed as described above, the drain electrode DE and the drain pad DP are continuously formed. Namely, an interface between a material constituting the drain electrode DE and a material constituting the drain pad DP is not formed between the drain electrode DE and the drain pad DP.

In the present embodiment, a vertical power transistor is realized. Furthermore, in the present embodiment, the width of the drain electrode DE is wide. Therefore, a contact resistance between the front end FE of the drain electrode DE and the fifth face F5 of the semiconductor layer SL is small. At the same time, a region where the stress of the semiconductor layer SL acts on the substrate SUB is decreased. In this case, the stress of the semiconductor layer SL acting on the substrate SUB is alleviated.

In the semiconductor device SD3, the metal film MF is formed inside the trench TRC. In other examples, in the same way as the semiconductor device SD1$f$, the semiconductor device SD3 may not include the metal film MF.

Fourth Embodiment

Figure 22:
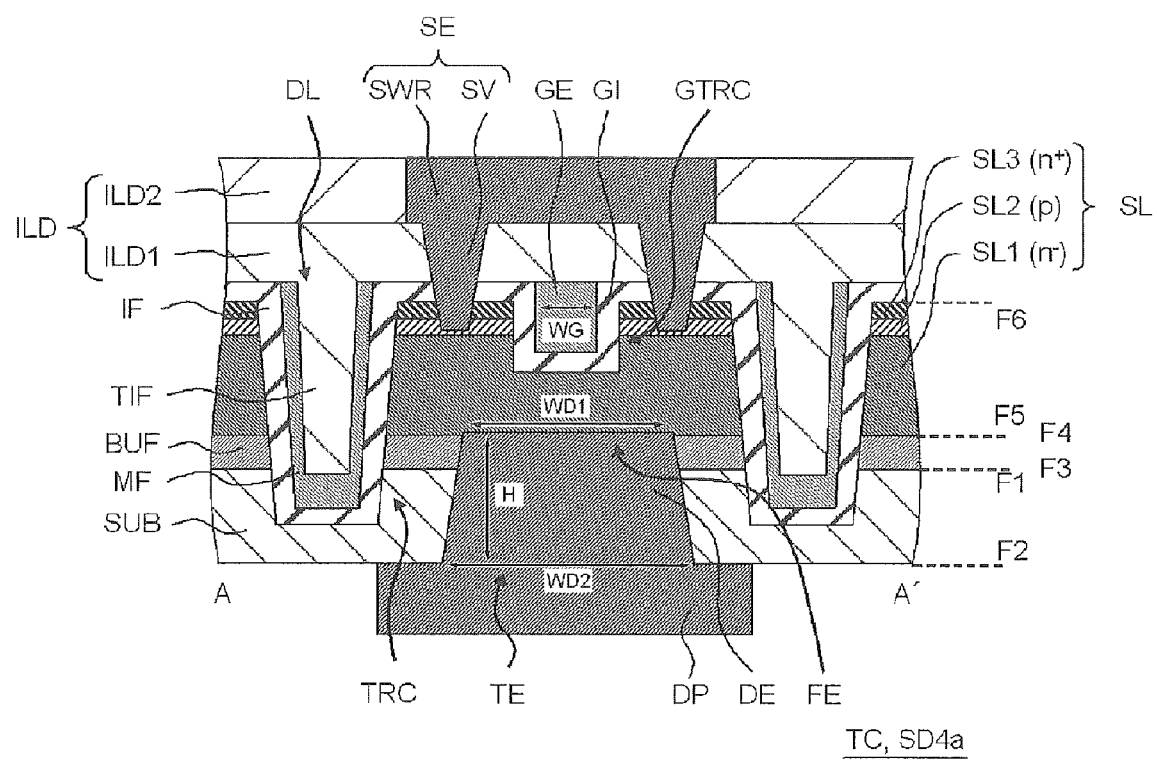
FIG. 22 is a cross-sectional view showing a semiconductor device according to a first example of a fourth embodiment.

FIG. 22 is a cross-sectional view showing a semiconductor device SD4$a$ according to a first example of a fourth embodiment. The semiconductor device SD4$a$ has the same configuration as that of the semiconductor device SD3 except that the transistor cell TC is a trench DMOS.

The semiconductor device SD4$a$ will be described in detail with reference to FIG. 22. As shown in FIG. 22, the transistor cell TC (the semiconductor device SD4$a$) includes the substrate SUB, the buffer layer BUF, and the semiconductor layer SL. The trench TRC is formed on a surface (the sixth face F6) of the semiconductor layer SL. The transistor cell TC of the present embodiment has the same configuration as that of the transistor cell TC of the third embodiment except for the semiconductor layer SL, the gate electrode GE, and the source electrode SE.

In the semiconductor device SD4$a$, the semiconductor layer SL includes a semiconductor layer SL1 (a first first-conductivity-type region), a semiconductor layer SL2 (a second-conductivity-type region), and a semiconductor layer SL3 (a second first-conductivity-type region). The semiconductor layer SL1, the semiconductor layer SL2, and the semiconductor layer SL3 are arranged in this order in a direction going from the fifth face F5 of the semiconductor layer SL to the sixth face F6. The gate electrode GE is buried in a trench GTRC (a gate trench). The trench GTRC is formed in the sixth face F6 of the semiconductor layer SL. The trench GTRC passes through the semiconductor layer SL3 and the semiconductor layer SL2. The bottom of the trench GTRC reaches the inside of the semiconductor layer SL1. The source electrode SE is coupled to the semiconductor layer SL2 and the semiconductor layer SL3.

In the present embodiment, the drain electrode DE passes through the substrate SUB and the buffer layer BUF in the same way as in the third embodiment. In this way, a vertical power transistor is realized.

Next, the details of the semiconductor device SD4$a$ will be described. In the present embodiment, the first conductivity-type is n-type and the second conductivity-type is p-type. In other examples, the first conductivity-type may be p-type and the second conductivity-type may be n-type.

In the present embodiment, the semiconductor layer SL1 is an n$^-$-type group III nitride semiconductor layer (for example, an n$^-$-type gallium nitride (GaN) layer). The semiconductor layer SL2 is a p-type group III nitride semiconductor layer (for example, a p-type gallium nitride (GaN) layer). The semiconductor layer SL3 is an n$^+$-type group III nitride semiconductor layer (for example, an n$^+$-type gallium nitride (GaN) layer). The impurity concentration of the semiconductor layer SL3 is higher than that of the semiconductor layer SL1. The semiconductor layer SL1, the semiconductor layer SL2, and the semiconductor layer SL3 are formed by epitaxial growth.

The gate electrode GE is buried in the trench GTRC. The trench GTRC is formed on the sixth face F6 of the semiconductor layer SL. The trench GTRC passes through the semiconductor layer SL3 and the semiconductor layer SL2. The bottom of the trench GTRC reaches the inside of the semiconductor layer SL1. Therefore, the semiconductor layer SL3 and the semiconductor layer SL2 are divided via the gate electrode GE in a plan view.

The source electrode SE is coupled to the semiconductor layers SL divided via the gate electrode GE. The source electrode SE includes the via SV and the wiring SWR. The via SV passes through the interlayer insulating film ILD1, the gate insulating film GI, and the semiconductor layer SL3. In this way, the vias SV reaches each of the semiconductor layers SL2 separated from each other. These vias SV are coupled to each other through the wiring SWR. Therefore, the semiconductor layers SL2 separated from each other have the same potential and the semiconductor layers SL3 separated from each other have the same potential.

In the same way as in the third embodiment, the front end FE of the drain electrode DE has a width larger than that of the gate electrode GE in a direction perpendicular to the extending direction of the gate electrode GE. In the same way as in the third embodiment, the gate electrode GE is formed so as to be located inside the front end FE of the drain electrode DE in a plan view in a direction perpendicular to the extending direction of the gate electrode GE. Furthermore, the width WD2 of the drain electrode DE at the second face F2 of the substrate SUB and the height H of the drain electrode DE satisfy H/WD2≤2.0 in the same way as in the third embodiment. The relationship between the arrangement of the drain electrode DE and the arrangement of the gate electrode GE is the same as that in the third embodiment. The drain electrode DE and the gate electrode GE may be arranged as shown in, for example, FIGS. 18A and 18B.

Next, a manufacturing method of the semiconductor device SD4$a$ will be described with reference to FIGS. 23A to 25B. FIGS. 23A to 25B are cross-sectional views showing the manufacturing method of the semiconductor device SD4$a$.

Figure 23A:
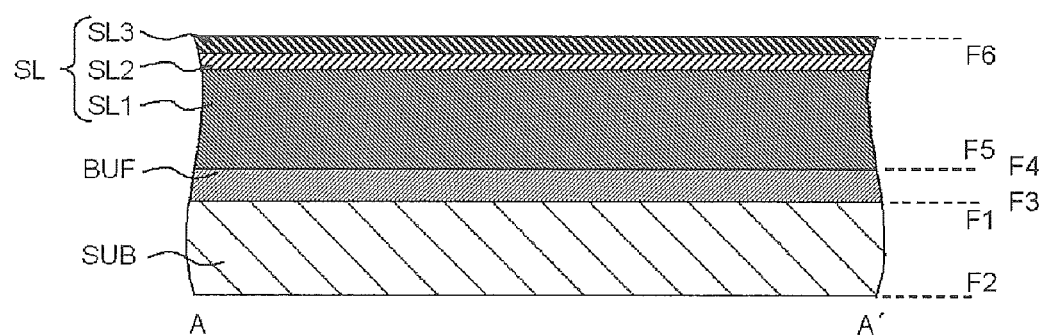
FIGS. 23A and 23B are cross-sectional views showing a manufacturing method of the semiconductor device shown in FIG. 22.
Figure 23B:
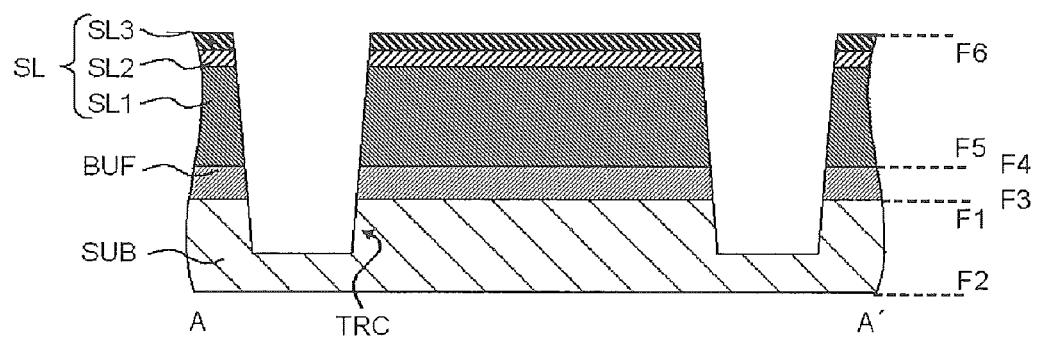

First, the buffer layer BUF is formed over the first face F1 of the substrate SUB. Next, the semiconductor layer SL1, the semiconductor layer SL2, and the semiconductor layer SL3 are formed in this order over the fourth face F4 of the buffer layer BUF (FIG. 23A). Subsequently, the trench TRC is formed by dry etching (FIG. 23B).

Figure 24A:
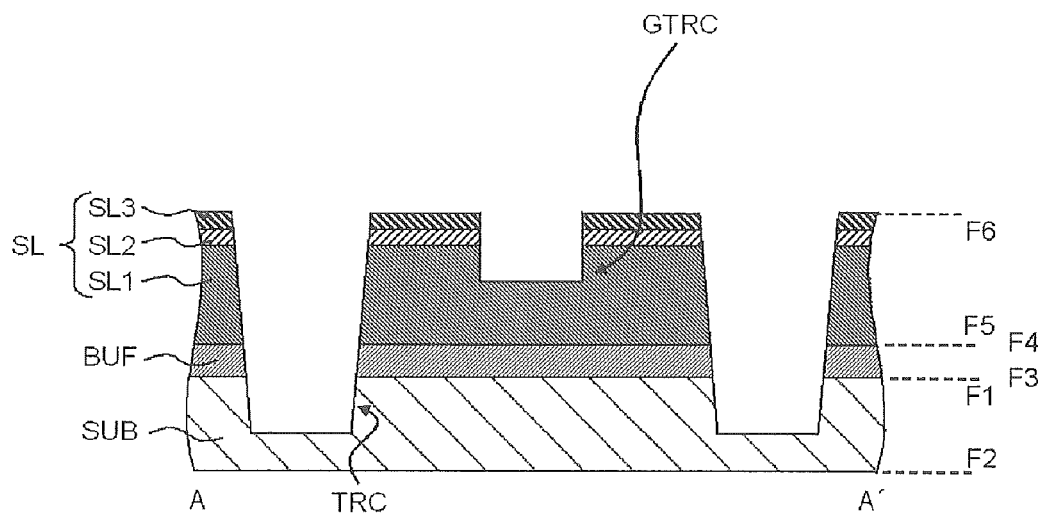
FIGS. 24A and 24B are cross-sectional views showing a manufacturing method of the semiconductor device shown in FIG. 22.
Figure 24B:
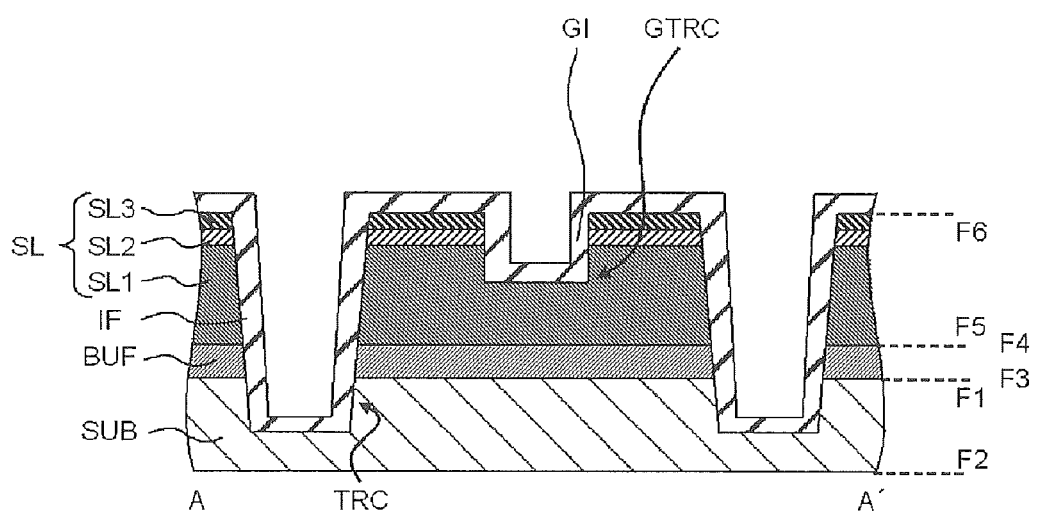
Figure 25A:
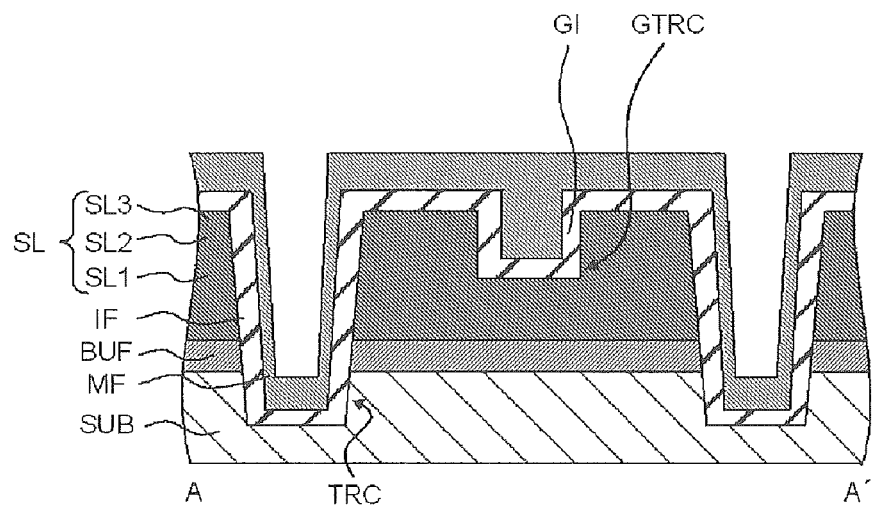
FIGS. 25A and 25B are cross-sectional views showing a manufacturing method of the semiconductor device shown in FIG. 22.
Figure 25B:
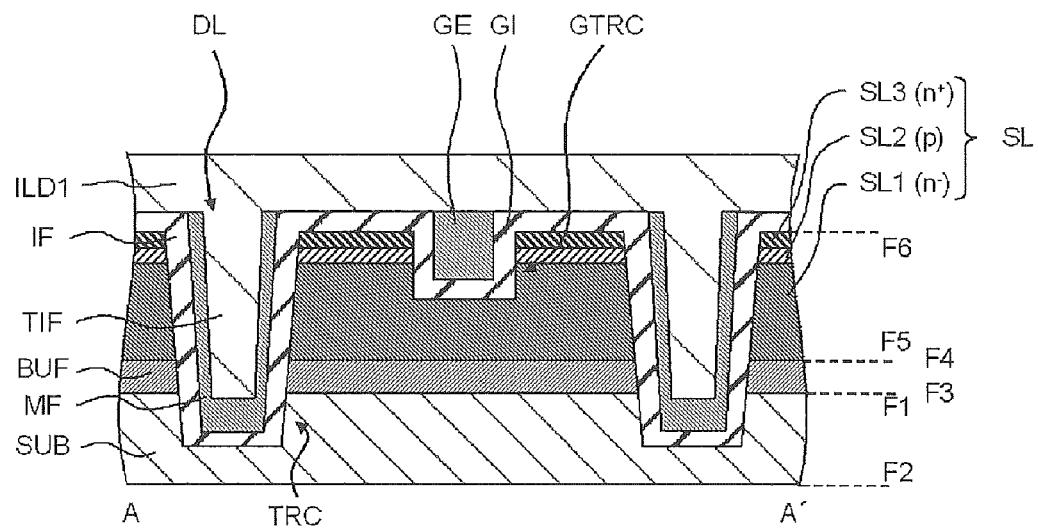

Then, the trench GTRC is formed by dry etching (FIG. 24A). Subsequently, the insulating film IF is formed on the entire sixth face F6 of the semiconductor layer SL (FIG. 24B) After that, the metal film MF is formed over the insulating film IF (FIG. 25A). Next, the gate electrode GE is formed by patterning. Subsequently, the interlayer insulating film ILD1 is formed (FIG. 25B).

Then, the interlayer insulating film ILD2 and the source electrode SE are formed in the same way as in the third embodiment. After that, the drain electrode DE and the drain pad DP are formed in the same way as in the third embodiment.

In the present embodiment, a vertical power transistor is realized. Furthermore, in the present embodiment, the width of the drain electrode DE is wide. Therefore, a contact resistance between the front end FE of the drain electrode DE and the fifth face F5 of the semiconductor layer SL becomes small. At the same time, a region where the stress of the semiconductor layer SL acts on the substrate SUB is decreased. In this case, the stress of the semiconductor layer SL acting on the substrate SUB is alleviated.

In the semiconductor device SD4a, the metal film MF is formed inside the trench TRC. In other examples, in the same way as the semiconductor device SD1f, the semiconductor device SD4a may not include the metal film MF.

Figure 26:
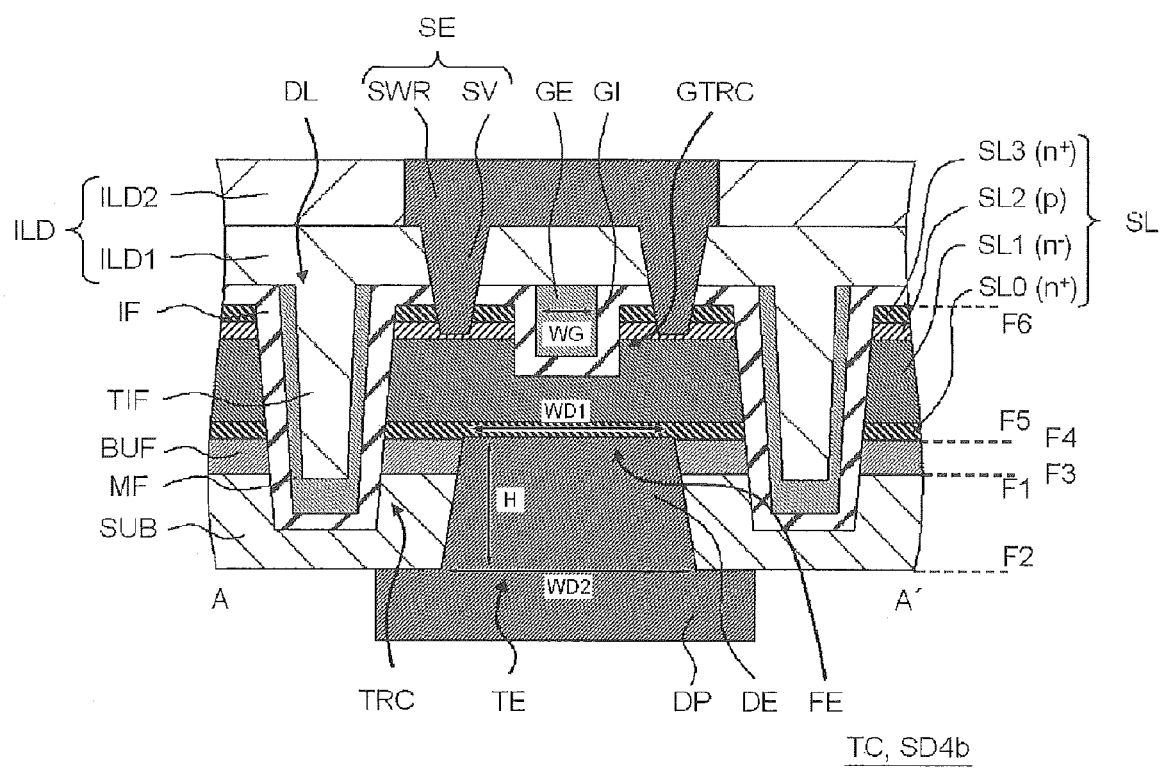
FIG. 26 is a cross-sectional view showing a semiconductor device according to a second example of the fourth embodiment.

Next, a semiconductor device SD4b according to a second example of the present embodiment will be described with reference to FIG. 26. FIG. 26 is a cross-sectional view showing the semiconductor device SD4b. The semiconductor device SD4b has the same configuration as that of the semiconductor device SD4a except that the semiconductor layer SL includes a semiconductor layer SL0.

In the semiconductor device SD4b, the semiconductor layer SL0 is formed between the buffer layer BUF and the semiconductor layer SL1. The semiconductor layer SL0 is an $n^+$-type group III nitride semiconductor layer (for example, an $n^+$-type gallium nitride (GaN) layer). The impurity concentration of the semiconductor layer SL0 is higher than that of the semiconductor layer SL1. The semiconductor layer SL0 is formed by epitaxial growth in the same way as the semiconductor layer SL1, the semiconductor layer SL2, and the semiconductor layer SL3. The fifth face F5 of the semiconductor layer SL serves as a surface of the semiconductor layer SL0. The front end FE of the drain electrode DE is coupled to the fifth face F5 of the semiconductor layer SL or remains inside the semiconductor layer SL0 without penetrating the semiconductor layer SL0.

Figure 27:
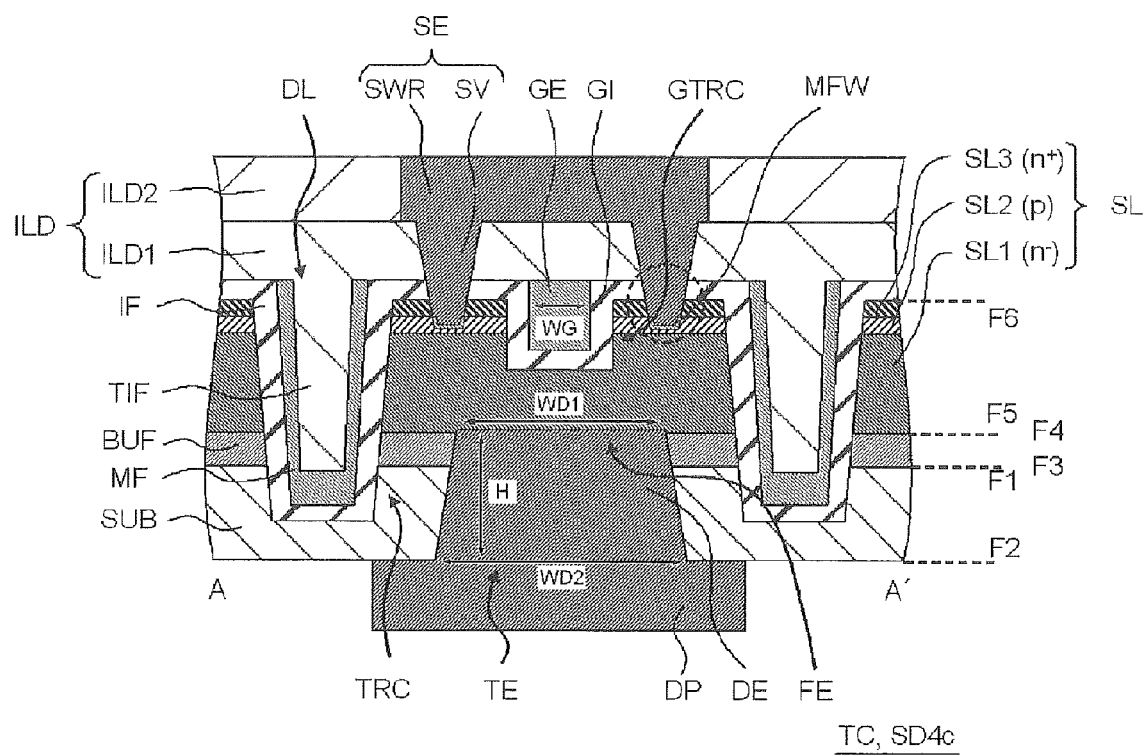
FIG. 27 is a cross-sectional view showing a semiconductor device according to a third example of the fourth embodiment.
Figure 28:
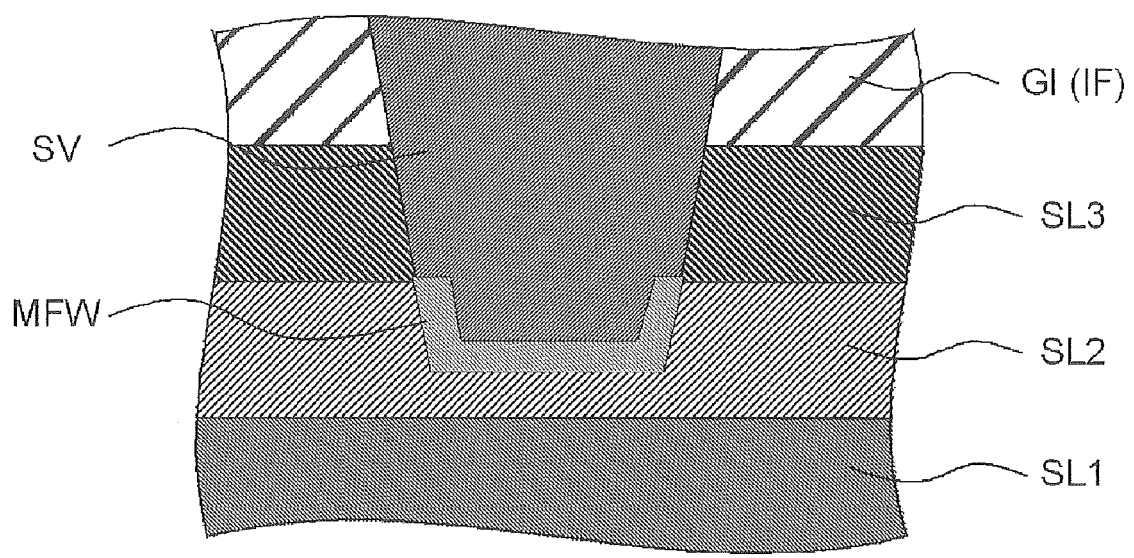
FIG. 28 is an enlarged view of a broken line circle in FIG. 27.

Next, a semiconductor device SD4c according to a third example of the present embodiment will be described with reference to FIGS. 27 and 28. FIG. 27 is a cross-sectional view showing the semiconductor device SD4c. FIG. 28 is an enlarged view of a broken line circle in FIG. 27. The semiconductor device SD4c has the same configuration as that of the semiconductor device SD4a except that the source electrode SE includes a metal film MFW. The metal film MFW is formed on a contact surface between the via SV and the semiconductor layer SL2. In this case, the metal film MFW may be formed only on the side surface of the via SV. Namely, the metal film MFW may be formed so as to expose the bottom surface of the via SV. The metal film MFW is formed of a metal having a work function of 5.0 eV or more. Examples of the metal film MFW include nickel (Ni), platinum (Pt), gold (Au), tantalum nitride (TaN), and tungsten nitride (WN). The metal film MFW can reduce the contact resistance between the via SV and the semiconductor layer SL2.

Fifth Embodiment

Figure 29:
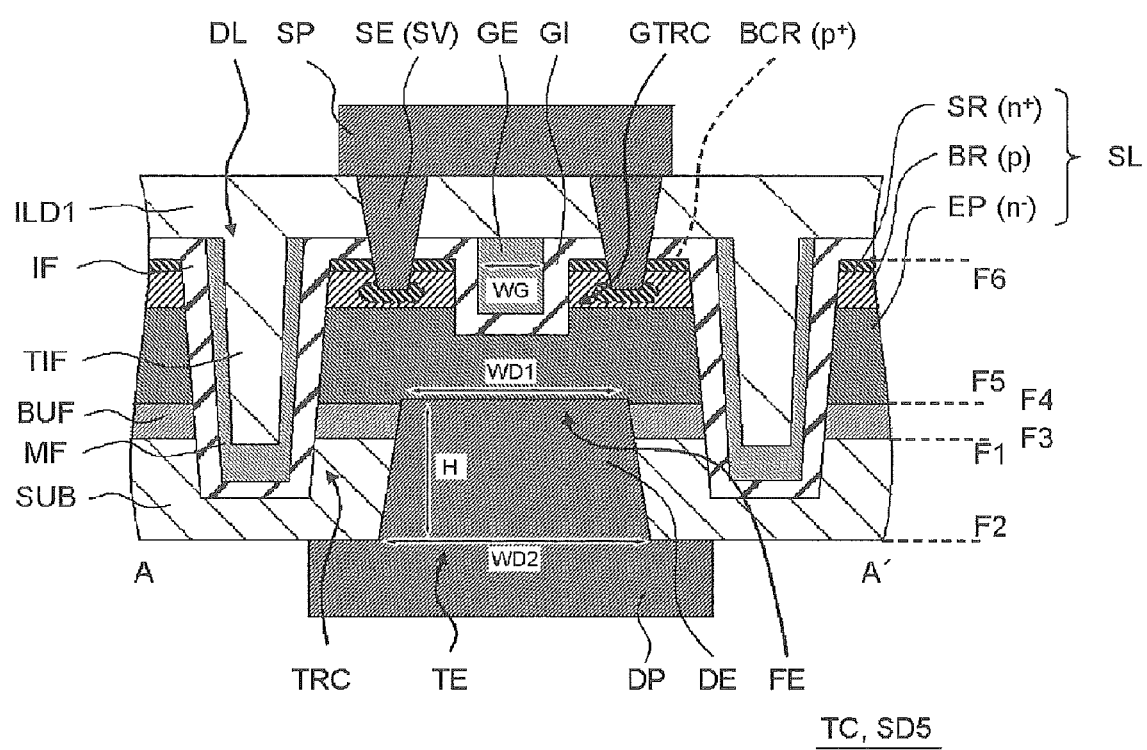
FIG. 29 is a cross-sectional view showing a semiconductor device according to a fifth embodiment.

FIG. 29 is a cross-sectional view showing a semiconductor device SD5 according to a fifth embodiment. The semiconductor device SD5 has the same configuration as that of the semiconductor device SD4a except the following points: The semiconductor layer SL includes a first conductivity-type (n-type) epitaxial layer EP, a second conductivity-type (p-type) base region BR (a first impurity region), a first conductivity-type (n-type) source region SR (a second impurity region), and a second conductivity-type (p-type) base contact region BCR (a third impurity region). The base region BR is formed on a surface of the epitaxial layer EP. The source region SR is formed on a surface of the base region BR. The base contact region BCR (the third impurity region) is buried in the base region BR. The base contact region BCR is formed at the bottom of the source electrode SE. The impurity concentration of the base contact region BCR is higher than that of the base region BR.

In the present embodiment, the drain electrode DE passes through the substrate SUB and the buffer layer BUF in the same way as in the third and the fourth embodiments. In this way, a vertical power transistor is realized.

Next, the details of the semiconductor device SD5 will be described. In the present embodiment, the first conductivity type is n-type and the second conductivity type is p-type. In other examples, the first conductivity type may be p-type and the second conductivity type may be n-type.

The epitaxial layer EP is formed by epitaxial growth. The epitaxial layer EP is an $n^-$-type group III nitride semiconductor layer (for example, an $n^-$-type gallium nitride (GaN) layer). The base region BR and the source region SR are formed on the surface of the epitaxial layer EP. The base region BR and the source region SR are formed by implanting impurities into the surface of the epitaxial layer EP. The conductivity type of the base region BR is p-type. The conductivity type of the source region SR is $n^+$-type. The impurity concentration of the source region SR is higher than that of the epitaxial layer EP. The depth of the source region SR is shallower than that of the base region BR.

The source electrode SE (via SV) passes through the interlayer insulating film ILD1, the gate insulating film GI, and the source region SR. The bottom of the source region SR reaches the inside of the base region BR. The source electrode SE (via SV) is coupled to the source pad SP. In the present embodiment, the source pad SP is formed over the interlayer insulating film ILD1.

The base contact region BCR is buried in the base region BR. The base contact region BCR is formed at the bottom of the source electrode SE (via SV). The conductivity type of the base contact region BCR is $p^+$-type. The impurity concentration of the base contact region BCR is higher than that of the base region BR.

Next, a manufacturing method of the semiconductor device SD5 will be described with reference to FIGS. 30A to 32B. FIGS. 30A to 32B are cross-sectional views showing the manufacturing method of the semiconductor device SD5.

Figure 30A:
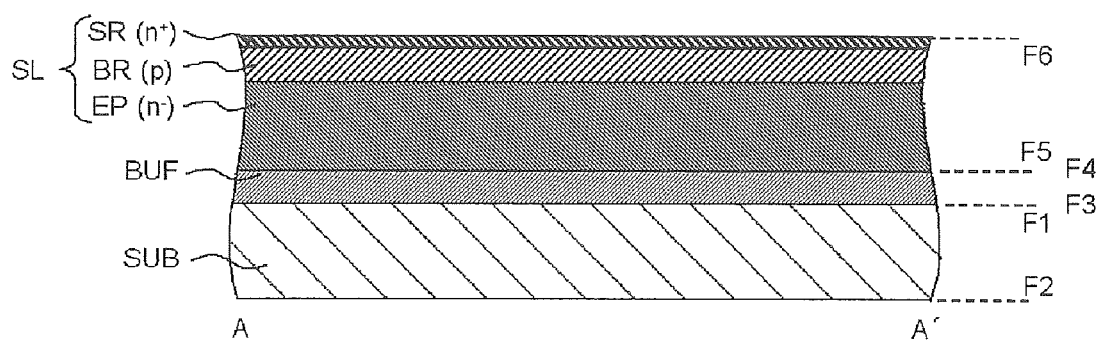
FIGS. 30A and 30B are cross-sectional views showing a manufacturing method of the semiconductor device shown in FIG. 29.

First, the buffer layer BUF is formed over the first face F1 of the substrate SUB. Subsequently, the epitaxial layer EP is formed over the fourth face F4 of the buffer layer BUF. The epitaxial layer EP is formed by epitaxial growth. P-type impurities (for example, magnesium) are ion-implanted into the surface of the epitaxial layer EP. Subsequently, n-type impurities (for example, silicon) are ion-implanted into the surface of the epitaxial layer EP. Subsequently, the epitaxial layer EP is annealed. Therefore, the ion-implanted impurities are activated. In this way, the base region BR and the source region SR are formed (FIG. 30A).

Figure 30B:
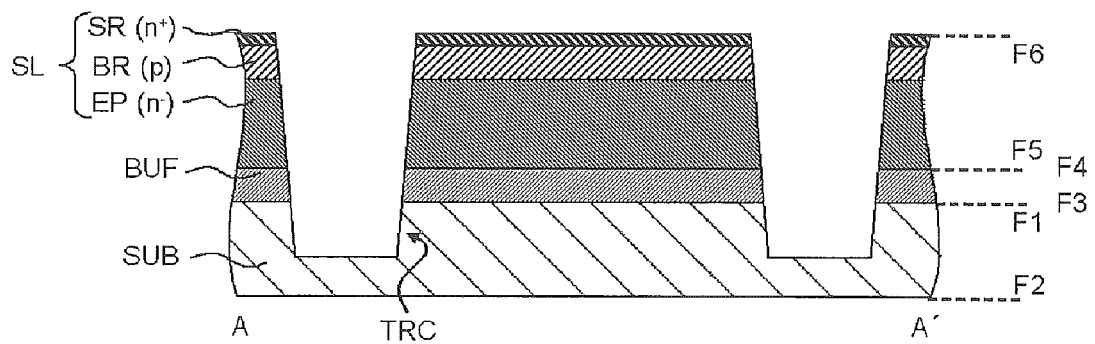
Figure 31A:
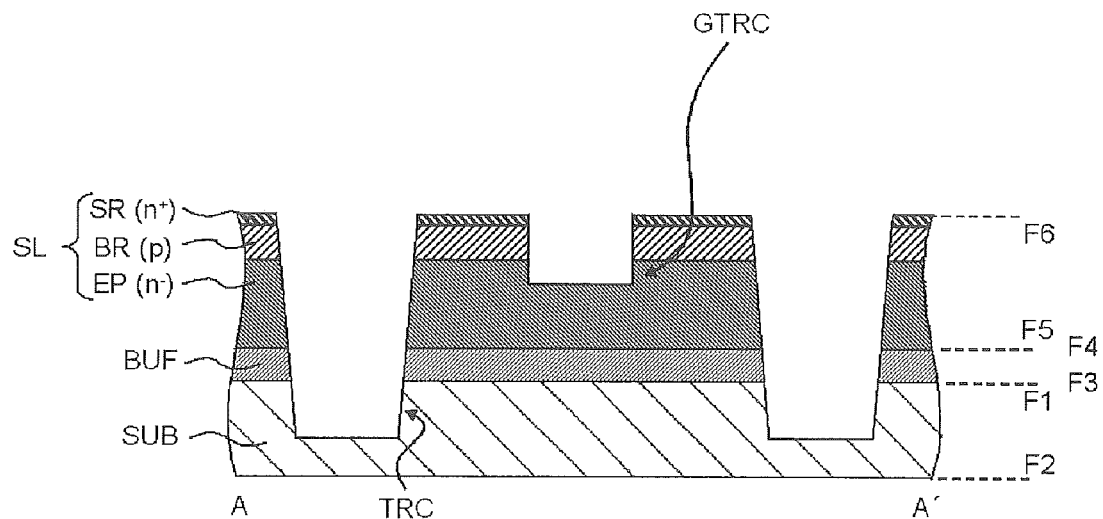
FIGS. 31A and 31B are cross-sectional views showing a manufacturing method of the semiconductor device shown in FIG. 29.
Figure 31B:
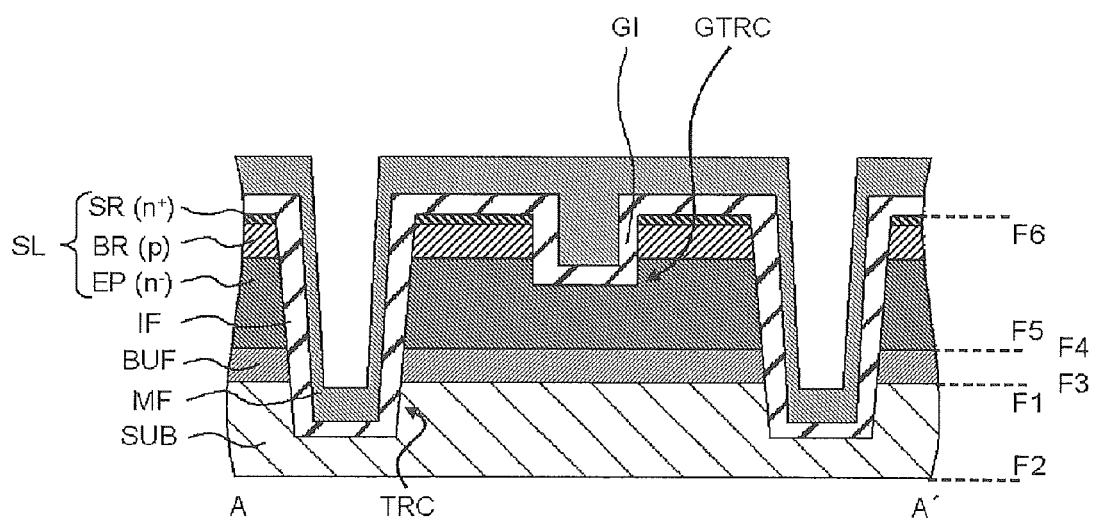

Next, the trench TRC is formed in the same way as in the first to the fourth embodiments (FIG. 30B). Subsequently, the trench GTRC is formed in the same way as in the fourth embodiment (FIG. 31A). Then, the insulating film IF and the metal film MF are formed in this order on the entire sixth face F6 of the semiconductor layer SL (FIG. 31B).

Next, the gate electrode GE is formed by patterning the metal film MF. Subsequently, the interlayer insulating film ILD1 is formed. Then, a contact hole CH is formed. The contact hole CH passes through the interlayer insulating film ILD1, the insulating film IF, and the source region SR and reaches the base region BR. After that, p-type impurities (for example, magnesium) are ion-implanted into the base region BR. In this case, the impurities are implanted into the base region BR through the contact hole CH. Therefore, the base contact region BCR is formed at the bottom of the contact hole CH (FIG. 32A).

Next, the source electrode SE (via SV) is buried in the contact hole CH (FIG. 32B). Subsequently, the source pad SP is formed over the interlayer insulating film ILD1. Then, the drain electrode DE and the drain pad DP are formed in the same way as in the fourth embodiment.

In the present embodiment, a vertical power transistor is realized. Furthermore, in the present embodiment, the width of the drain electrode DE is wide. Therefore, a contact resistance between the front end FE of the drain electrode DE and the fifth face F5 of the semiconductor layer SL is decreased. At the same time, a region where the stress of the semiconductor layer SL acts on the substrate SUB is decreased. In this case, the stress of the semiconductor layer SL acting on the substrate SUB is alleviated.

In the semiconductor device SD5, the metal film MF is formed inside the trench TRC. In other examples, in the same way as the semiconductor device SD1f, the semiconductor device SD5 may not include the metal film MF.

According to the embodiments described above, the following invention is disclosed.

(Appendix 1)

A semiconductor device including
a substrate which includes a first face and a second face facing the first face and in which at least the first face is formed of silicon,
a buffer layer which is formed of a first group III nitride semiconductor and includes a third face and a fourth face facing the third face and in which the third face faces the first face of the substrate,
a semiconductor layer which is formed of a second group III nitride semiconductor and includes a fifth face and a sixth face facing the fifth face and in which the fifth face faces the first face of the substrate via the buffer layer,
a source electrode coupled to the sixth face of the semiconductor layer,
a drain electrode coupled to the sixth face of the semiconductor layer,
a gate electrode which faces the buffer layer via the semiconductor layer and which is formed between the source electrode and the drain electrode in a plan view,
an interlayer insulating film which is formed so as to cover the source electrode, the drain electrode, and the gate electrode,
a source pad which is coupled to the source electrode and faces the sixth face of the semiconductor layer via the interlayer insulating film,
a drain pad which is coupled to the drain electrode and faces the sixth face of the semiconductor layer via the interlayer insulating film, and
a gate pad which is coupled to the gate electrode and faces the sixth face of the semiconductor layer via the interlayer insulating film,
wherein a trench is formed on the sixth face of the semiconductor layer so that the trench surrounds the source pad, the drain pad, and the gate pad in a plan view, and the trench passes through the semiconductor layer, the buffer layer, and the substrate.

Hereinabove, the invention made by the inventors has been specifically described on the basis of the embodiments, but it goes without saying that the present invention is not limited to the embodiments described above, and can be modified variously within a range not departing from the gist of the present invention.

What is claimed is:

1. A semiconductor device comprising:
    a substrate which includes a first face and a second face facing the first face and in which at least the first face comprises silicon;
    a buffer layer which comprises a first group III nitride semiconductor and includes a third face and a fourth face facing the third face and in which the third face faces the first face of the substrate;
    a semiconductor layer which comprises a second group III nitride semiconductor and includes a fifth face and a sixth face facing the fifth face and in which the fifth face faces the first face of the substrate via the buffer layer;
    a source electrode coupled to the sixth face of the semiconductor layer;
    a drain electrode coupled to the sixth face of the semiconductor layer;
    a gate electrode which faces the buffer layer via the semiconductor layer and which is formed between the source electrode and the drain electrode in a plan view;
    an interlayer insulating film which is formed so as to cover the source electrode, the drain electrode, and the gate electrode;
    a source pad which is coupled to the source electrode and faces the sixth face of the semiconductor layer via the interlayer insulating film;
    a drain pad which is coupled to the drain electrode and faces the sixth face of the semiconductor layer via the interlayer insulating film; and
    a gate pad which is coupled to the gate electrode and faces the sixth face of the semiconductor layer via the interlayer insulating film,
    wherein a trench is formed on the sixth face of the semiconductor layer so that the trench surrounds the source pad, the drain pad, and the gate pad in a plan view, the trench passes through the semiconductor layer and the buffer layer, and a bottom of the trench reaches at least an inside of the substrate, and
    the semiconductor device further comprises:
        an insulating film which is formed from a bottom surface of the trench to side surfaces of the trench and whose surface is formed along the bottom surface and the side surfaces of the trench; and
        a metal film which is formed inside the insulating film in the trench and which is formed at least from the substrate to the buffer layer in a height direction of the trench, the metal film and the gate electrode comprising the same layer; and
        a gate insulating film formed on the sixth face of the semiconductor layer, the gate electrode being formed on an upper surface of the gate insulating film, and an upper surface of the metal film being substantially coplanar with the upper surface of the gate insulating film,
    wherein a distance from the first face of the substrate to the bottom of the trench is 100 nm or more in a thickness direction of the substrate.

2. The semiconductor device according to claim 1, wherein the gate insulating film is formed between the semiconductor layer and the gate electrode, and
wherein the gate insulating film and the insulating film comprise a same material.

3. The semiconductor device according to claim 2, wherein the gate insulating film and the insulating film are continuously formed from the sixth face of the semiconductor layer to the side surface of the trench.

4. The semiconductor device according to claim 1, wherein the interlayer insulating film is buried in the trench.

5. The semiconductor device according to claim 1, wherein the metal film is formed along a sidewall of the insulating film to a height which is greater than a height of the sixth face of the semiconductor layer.

6. The semiconductor device according to claim 1, wherein the metal film inhibits water from entering an interface between the first face of the substrate and the third face of the buffer layer.

7. The semiconductor device according to claim 1, wherein a thickness of the substrate is 200 nm or less.

8. The semiconductor device according to claim 1, wherein the trench defines a dicing line and alleviates stress applied to the substrate by the semiconductor layer due to a lattice mismatch.

9. The semiconductor device according to claim 1, wherein the first group III nitride semiconductor of the buffer layer is selected from the group consisting of aluminum nitride (AlN), aluminum gallium nitride (AlGaN), and gallium nitride (GaN).

10. The semiconductor device according to claim 1, wherein the semiconductor layer comprises doped gallium nitride (GaN).

11. The semiconductor device according to claim 1, wherein a sum of a thickness of the semiconductor layer and a thickness of the buffer layer is 4 µm or more.

12. The semiconductor device according to claim 1, wherein the trench comprises a plurality of trenches, and
wherein the semiconductor device comprises a metal oxide semiconductor field effect transistor (MOSFET), and a channel of the MOSFET is formed in the semiconductor layer between a first trench of the plurality of trenches and a second trench of the plurality of trenches.

13. The semiconductor device according to claim 12, wherein the MOSFET further comprises the gate insulating film formed on the sixth face of the semiconductor layer and on the channel region.

14. The semiconductor device according to claim 13, wherein the MOSFET further comprises the gate electrode formed on the gate insulating film between the first and second trenches.

15. The semiconductor device according to claim 14, wherein the MOSFET further comprises source and drain regions formed in the sixth face of the semiconductor layer between the first and second trenches, and coupled to the source electrode and the drain electrode respectively.

16. The semiconductor device according to claim 15, wherein a sidewall of the source region forms a sidewall of the first trench and a sidewall of the drain region forms a sidewall of the second trench.

17. The semiconductor device according to claim 1, wherein a width of the trench is 100 nm or more and 2 µm or less, and the width of the trench is gradually reduced from the semiconductor layer toward the substrate.

18. A semiconductor device comprising:
a substrate which includes a first face and a second face facing the first face and in which at least the first face comprises silicon;
a buffer layer which comprises a first group III nitride semiconductor and includes a third face and a fourth face facing the third face and in which the third face faces the first face of the substrate;
a semiconductor layer which comprises a second group III nitride semiconductor and includes a fifth face and a sixth face facing the fifth face and in which the fifth face faces the first face of the substrate via the buffer layer;
a gate electrode formed on the sixth face of the semiconductor layer;
a trench formed on the sixth face of the semiconductor layer so that the trench passes through the semiconductor layer and the buffer layer, and a bottom of the trench reaches at least an inside of the substrate, such that a distance from the first face of the substrate to the bottom of the trench is 100 nm or more in a thickness direction of the substrate;
an insulating film which is formed from a bottom surface of the trench to side surfaces of the trench and whose surface is formed along the bottom surface and the side surfaces of the trench;
a metal film which is formed inside the insulating film in the trench and which is formed at least from the substrate to the buffer layer in a height direction of the trench, the metal film and the gate electrode comprising the same layer; and
a gate insulating film formed on the sixth face of the semiconductor layer, the gate electrode being formed on an upper surface of the gate insulating film, and an upper surface of the metal film being substantially coplanar with the upper surface of the gate insulating film.

19. A semiconductor device comprising:
a substrate which includes a first face and a second face facing the first face and in which at least the first face comprises silicon, a thickness of the substrate being 200 µm or less;
a buffer layer which comprises a first group III nitride semiconductor and includes a third face and a fourth face facing the third face and in which the third face faces the first face of the substrate, the first group III nitride semiconductor of the buffer layer being selected from the group consisting of aluminum nitride (AlN), aluminum gallium nitride (AlGaN), and gallium nitride (GaN);
a semiconductor layer which comprises a second group III nitride semiconductor and includes a fifth face and a sixth face facing the fifth face and in which the fifth face faces the first face of the substrate via the buffer layer, wherein the semiconductor layer comprises doped gallium nitride (GaN), and a sum of a thickness of the semiconductor layer and a thickness of the buffer layer is 4 µm or more;
first and second trenches formed on the sixth face of the semiconductor layer for alleviating stress applied to the substrate by the semiconductor layer due to a lattice mismatch, the first and second trenches passing through the semiconductor layer and the buffer layer, and a bottom of the trenches reaching at least an inside of the substrate such that a distance from the first face of the substrate to the bottom of the trench is 100 nm or more in a thickness direction of the substrate, and a width of a trench of the first and second trenches is 100 nm or more and 2 µm or less, and the width of the trench is gradually reduced from the semiconductor layer toward the substrate;

a channel region formed in the semiconductor layer between the first and second trenches;

a gate insulating film formed on the sixth face of the semiconductor layer on the channel region, and between the first and second trenches in a plan view;

a gate electrode formed on the gate insulating film between the first and second trenches in a plan view;

source and drain regions formed in the sixth face of the semiconductor layer between the first and second trenches, and coupled to the source electrode and the drain electrode respectively, a sidewall of the source region forms a sidewall of the first trench and a sidewall of the drain region forms a sidewall of the second trench;

an insulating film which is formed from a bottom surface of the first and second trenches to side surfaces of the first and second trenches and having a surface which is formed along the bottom surface and the side surfaces of the first and second trenches; and a metal film which is formed inside the insulating film in the first and second trenches and which is formed at least from the substrate to the buffer layer in a height direction of the first and second trenches, the metal film inhibiting water from entering an interface between the first face of the substrate and the third face of the buffer layer, the metal film and the gate electrode comprising the same layer, wherein the gate electrode is formed on an upper surface of the gate insulating film, and an upper surface of the metal film is substantially coplanar with the upper surface of the gate insulating film.

* * * * *